(12) United States Patent
Fukui et al.

(10) Patent No.: US 7,857,431 B2
(45) Date of Patent: Dec. 28, 2010

(54) PIEZOELECTRIC SUBSTANCE ELEMENT, PIEZOELECTRIC SUBSTANCE FILM MANUFACTURING METHOD, LIQUID DISCHARGE HEAD AND LIQUID DISCHARGE APPARATUS

(75) Inventors: Tetsuro Fukui, Yokohama (JP); Kenichi Takeda, Yokohama (JP); Toshihiro Ifuku, Yokohama (JP); Hiroshi Funakubo, Yokohama (JP); Shintaro Yokoyama, Yokohama (JP); Yong Kwan Kim, Yokohama (JP); Hiroshi Nakaki, Yokohama (JP); Risako Ueno, Yokohama (JP); Shoji Okamoto, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 427 days.

(21) Appl. No.: 11/813,943

(22) PCT Filed: Jan. 18, 2006

(86) PCT No.: PCT/JP2006/301073

§ 371 (c)(1),
(2), (4) Date: Jun. 3, 2008

(87) PCT Pub. No.: WO2006/078041

PCT Pub. Date: Jul. 27, 2006

(65) Prior Publication Data

US 2009/0128608 A1     May 21, 2009

(30) Foreign Application Priority Data

Jan. 19, 2005  (JP) ............................. 2005-012131
Feb. 10, 2005  (JP) ............................. 2005-034956
Sep. 5, 2005   (JP) ............................. 2005-257132

(51) Int. Cl.
   *B41J 2/045* (2006.01)
(52) U.S. Cl. ............................................. 347/68
(58) Field of Classification Search .................. 347/68, 347/69–72; 310/311, 324, 358, 360; 400/124.14, 400/124.16; 29/25.35, 890.1
   See application file for complete search history.

(56) References Cited

U.S. PATENT DOCUMENTS 6,198,208 B1    3/2001  Yano et al. ................... 310/358

(Continued)

FOREIGN PATENT DOCUMENTS

CN          1274954         11/2000

(Continued)

OTHER PUBLICATIONS

Apr. 25, 2006 Written Opinion of PCT International Searching Authority for PCT/JP2006/301073.

(Continued)

*Primary Examiner*—K. Feggins
(74) *Attorney, Agent, or Firm*—Fitzpatrick, Cella, Harper & Scinto

(57) ABSTRACT

A piezoelectric substance element has a piezoelectric substance film and a pair of electrodes connected to the piezoelectric substance film on a substrate, and a main component of the piezoelectric substance film is $Pb(Zr, Ti)O_3$, a composition ratio of $Zr/(Zr+Ti)$ is over 0.4 but less than 0.7, the piezoelectric substance film is a film having at last a tetragonal crystal a-domain and a c-domain within a range of ±10° with respect to the surface of the substrate, and a volume rate of the c-domain to the total of the a-domain and the c-domain is equal to or larger than 20% and equal to or smaller than 60%.

18 Claims, 14 Drawing Sheets

U.S. PATENT DOCUMENTS

| | | |
|---|---|---|
| 6,841,490 B2 | 1/2005 | Unno et al. ................ 438/761 |
| 7,120,978 B2 | 10/2006 | Wasa et al. ................ 29/25.35 |
| 7,279,825 B2 | 10/2007 | Ifuku et al. ................ 310/358 |
| 2007/0046152 A1 | 3/2007 | Ifuku et al. ................ 310/358 |
| 2007/0046153 A1 | 3/2007 | Matsuda et al. ............ 310/358 |
| 2007/0046734 A1 | 3/2007 | Aoki et al. .................. 347/68 |
| 2007/0048190 A1 | 3/2007 | Ifuku et al. ................ 422/100 |
| 2007/0090728 A1 | 4/2007 | Matsuda et al. ............ 310/358 |
| 2008/0012910 A1* | 1/2008 | Matsuda et al. ............. 347/68 |
| 2008/0203856 A1* | 8/2008 | Miyazawa ................. 310/358 |
| 2008/0211881 A1* | 9/2008 | Ifuku et al. .................. 347/70 |

FOREIGN PATENT DOCUMENTS

| | | |
|---|---|---|
| EP | 1 054 460 A2 | 11/2000 |
| JP | 08-116103 | 5/1996 |
| JP | 2000-332569 | 11/2000 |
| JP | 2001-220676 | 8/2001 |
| JP | 2003-098124 | 4/2003 |
| WO | WO 2004/068605 A1 | 8/2004 |

OTHER PUBLICATIONS

Apr. 25, 2006 PCT International Search Report for PCT/JP2006/301073.

* cited by examiner

PIEZOELECTRIC SUBSTANCE ELEMENT, PIEZOELECTRIC SUBSTANCE FILM MANUFACTURING METHOD, LIQUID DISCHARGE HEAD AND LIQUID DISCHARGE APPARATUS

TECHNICAL FIELD

The present invention generally relates to a piezoelectric substance element exhibiting preferable characteristics, and more particularly to a piezoelectric substance element suited to a liquid discharge head (an inkjet head) and a MEMS (Micro Electro Mechanical System) element.

BACKGROUND ART

With the spread of research into the MEMS and piezoelectric application, a thin piezoelectric substance film exhibiting a good characteristic is desired as a piezoelectric substance element. The piezoelectric substance element expands and contracts in a way that pinches the piezoelectric substance film with electrodes and applying an electric field thereto, and can be applied to a motor, a supersonic motor, an actuator, etc. PZT-series materials discovered approximately 50 years ago are main materials utilized in the applied field. The PZT material is equal to or higher than 1100° C. in its sintering temperature, and there is seen a progress of material development employing a sol-gel method, a sputtering method, an MBE (Molecular Beam Epitaxial) method, a PLD (Pulsed Laser Deposition) method, a CVD (Chemical Vapor Deposition) method, etc., in order to apply the piezoelectric substance element as a thin film element. In the case of its being applied as the thin film, however, a problem is that characteristics equal to those of the ceramics cannot be acquired. For solving this problem, for example, Japanese Patent Application Laid-Open No. H08-116103 discloses a method of controlling crystalline orientation to a (001) mono-crystal. Japanese Patent Application Laid-Open No. 2000-332569 (corresponding to U.S. Pat. No. 6,198,208) proposes employing a 90-degree domain where (100) orientation and (001) orientation taking a tetragonal crystal structure exist in mixture.

Even by the method disclosed in Japanese Patent Application Laid-Open No. H08-116103, the characteristics equal to those of ceramics are not exhibited on the side of a high electric field, and the piezoelectric substance element is inferior in terms of a function of the element. Further, the method disclosed in Japanese Patent Application Laid-Open No. 2000-332569 has such problems that an MPB (Morphotropic Phase Boundary) area cannot be utilized and that a (100) orientation-to-(001) orientation ratio cannot be controlled with high reproducibility. Moreover, a film with an increased ratio of the (100) orientation has a problem of being inferior in terms of film durability as the thin film element.

DISCLOSURE OF THE INVENTION

It is an object of the present invention to solve the problems given above and to provide a piezoelectric substance element exhibiting a high piezoelectric characteristic and preferable durability, a piezoelectric substance film manufacturing method, a liquid discharge head and a liquid discharge apparatus. According to the present invention, an MEMS element etc having excellent displacement controllability and durability can be also provided.

According to a first mode of a piezoelectric substance element of the present invention, there provides a piezoelectric substance element having a piezoelectric substance film and a pair of electrodes connected to the piezoelectric substance film on a substrate, wherein a main component of the piezoelectric substance film is $Pb(Zr, Ti)O_3$, a composition ratio of Zr/(Zr+Ti) is over 0.4 but less than 0.7, the piezoelectric substance film is a film having at last a tetragonal crystal a-domain and a c-domain within a range of ±10° with respect to the surface of the substrate, and a volume rate of the c-domain to the total of the a-domain and the c-domain is equal to or larger than 20% and equal to or smaller than 60%.

According to a second mode of a piezoelectric substance element of the present invention, there provides a piezoelectric substance element having a piezoelectric substance film and a pair of electrodes connected to the piezoelectric substance film on a substrate, wherein a main component of the piezoelectric substance film is $Pb(Zr, Ti)O_3$, a composition ratio of Zr/(Zr+Ti) is over 0.4 but less than 0.7, the piezoelectric substance film is a film having at last a tetragonal crystal a-domain and a c-domain within a range of ±10° with respect to the surface of the substrate, and at least some of the a-domain and the c-domain are in a twinning enantiomorphic relationship where a (N0N) (N is an integer) plane is a twinning crystal plane.

According to a third mode of a piezoelectric substance element of the present invention, there provides a piezoelectric substance element having a piezoelectric substance film and a pair of electrodes connected to the piezoelectric substance film, wherein a main component of the piezoelectric substance film is $Pb(Zr, Ti)O_3$, the piezoelectric substance film is a film having a tetragonal crystal a-domain and a c-domain, and, in a [001] axial length and a [100] axial length that configure the domains, a [001] axial length/[100] axial length ratio is equal to or larger than 1.004 and equal to or smaller than 1.040.

BEST MODE FOR CARRYING OUT THE INVENTION

Figure 5:
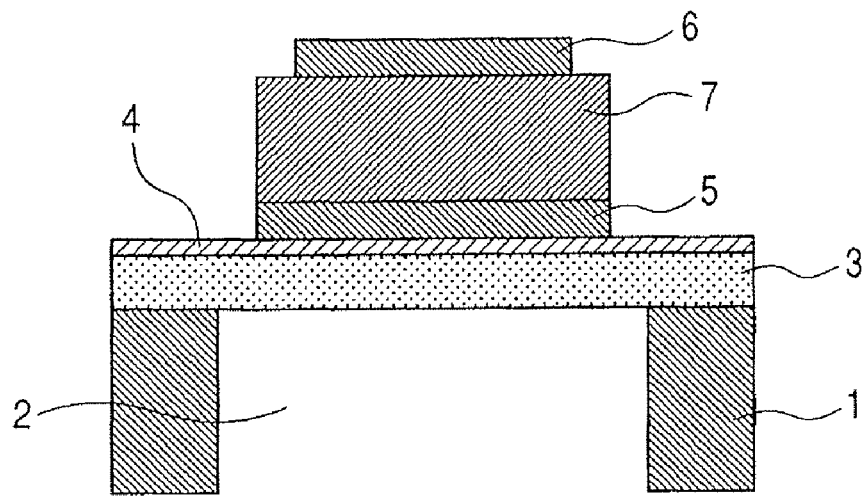
FIG. 5 is a sectional view showing a structural example of a piezoelectric substance element according to the present invention.

FIG. 5 shows a schematic diagram of a piezoelectric substance element according to the present invention. The numeral 7 represents a piezoelectric substance film, numerals 5, 6 stand for electrodes, 4 designates a buffer layer, and 3 denotes a diaphragm. In the case of utilizing the piezoelectric substance element for an inkjet head, the numeral 1 represents a partition wall 1, and 2 designates part of a chamber filled with a discharged material (e.g., an ink). In the case of manufacturing the piezoelectric substance element by the manufacturing method according to the present invention, such a configuration can be taken that the partition wall 1 and the diaphragm 3 are composed of Si, or alternatively the diaphragm 3 and the buffer layer 4 are formed as a single layer serving as both of the buffer layer and the diaphragm, wherein the partition wall 1 is composed of Si. A film thickness of the piezoelectric substance film can be selected from within a range of 0.5 μm through 10 μm and, preferably, 10 μm through 6.0 μm. A thickness of the diaphragm can be selected from within a range of 1.0 μm through 15 μm and, preferably, 2.0 μm through 8.0 μm. An adhesion layer may be interposed between an upper electrode 6 and the piezoelectric substance film 7.

It should be noted that an expression [one unspecified value through another unspecified value] or [one unspecified value–another unspecified value] connotes [being equal to or larger than one unspecified value and being equal to or smaller than another unspecified value] in any case in the specification of the present application.

Over the recent years, there has been made a trial to improve a characteristic of the piezoelectric substance element in a way that controls a crystal structure of the piezoelectric substance film. However, a situation is that the crystal structure exceeding a piezoelectric characteristic equal to ceramics is not clarified in the piezoelectric substance film having a film thickness equal to or smaller than 25 μm. In this piezoelectric substance film, it is reported that there is an effect due to orientation such as a $d_{33}$ constant being large in an area where morphotropic phases exist in mixture in a (111) alignment film. However, the clarity is not given to a $d_{31}$ constant in the case of utilizing the piezoelectric substance element as a unimorph type. This is regarded, the thin film being restricted by a substrate, due to a possibility in which the same relationship between the $d_{33}$ constant and the $d_{31}$ constant as that of the ceramics is not established. Therefore, as in Japanese Patent Application Laid-Open No. 2000-332569 given above, it is one of useful means for improving the piezoelectric property to make use of a 90-degree domain where a (100) orientation and a (001) orientation each taking a tetragonal structure exist in mixture. In the case of using the 90-degree domain, however, as described in Japanese Patent Application Laid-Open No. 2000-332569, it is written that the (001) mono-orientation occurs in an MPB area and the piezoelectric property declines. Herein, as to the MPB area, a composition ratio of Zr/(Zr+Ti) is approximately 0.5 or thereabouts in Pb(Zr, Ti)O$_3$. Further, there is a defect in terms of durability such as being unable to follow a high-frequency drive with respect to displacement and being easy to cause a crack in the film in use. The present inventors found out, as a method of solving the problems given above, that the piezoelectric property can be improved even when the composition ratio of Zr/(Zr+Ti) is over 0.4 but less than 0.7 by limiting volume rates of tetragonal crystal a-domain and c-domain of the piezoelectric substance film of the piezoelectric substance element.

Further, even when the composition ratio of Zr/(Zr+Ti) is over 0.4 but less than 0.7, it proves the following points that at least some of the a-domain and the c-domain take a twinning crystal enantiomorphic relationship.

(1) A structure having the a-domain and the c-domain is easy to occur.

(2) It is possible to overcome the defect of the durability such as being easy to cause the crack in the film in use.

(3) The crack gets hard to occur in a patterning film in such an application as to effect fine patterning of the piezoelectric substance film.

Moreover, in a range of 1.004-1.040 smaller in ratio given by [001] axial length/[100] axial length that configures the a-domain and the c-domain than in Japanese Patent Application Laid-Open No. 2000-332569, domain switching becomes easy to take place, and it was found out that excellent characteristics both in the piezoelectric property and in the durability are exhibited. Still further, it was discovered that on the occasion of applying an electric field to the piezoelectric substance element, the a-domain changes into the c-domain each time the electric field is applied. Namely, when stopping the application of the electric field, the changed c-domain returns again to the a-domain, and this is repeated, whereby a large piezoelectric characteristic occurs. Further, Japanese Patent Application Laid-Open No. 2000-332569 given above describes that in the MPB area, the (001) mono-orientation occurs, and the piezoelectric property declines. By contrast, according to the present invention, it was discovered that the sufficient a-domain can be made to exist even when the Zr/(Zr+Ti) ratio is over 0.4 but less than 0.7, perhaps depending on a difference in manufacturing method.

Herein, the a-domain of the piezoelectric substance film composed mainly of Pb(Zr, Ti)O$_3$ is a generic term of a domain having a (100) plane within a ±10° range with respect to the substrate surface, i.e., having crystal axes in [100] azimuths within the ±10° range in a film thickness direction. Further, the c-domain of the piezoelectric substance film composed mainly of Pb(Zr, Ti)O$_3$ is a generic term of the following domain. This domain has a (001) plane within the ±10° range with respect to the substrate surface, i.e., having crystal axes in [001] azimuths within the ±10° range in the film-thickness direction.

Moreover, the twinning crystal structure according to the present invention is a structure configured by a domain having the twinning enantiomorphic relationship in which at least some of the a-domain and the c-domain have a (N0N) plane (N is an integer) defined as a twinning plane.

Further, the [001] axial length/[100] axial length ratio according to the present invention, which configure the a-domain and the c-domain, is defined as a ratio given by a c-axis length/a-axis length of the crystal lattices of the tetragonal crystal Pb(Zr, Ti)O$_3$ that configure the a-domain and the c-domain.

In each of modes described above, it is preferable that a volume rate of the c-domain to a total of the a-domain and the c-domain is equal to or larger than 20% and equal to or smaller than 60%. This volume rate is more preferably equal to or larger than 25% and equal to or smaller than 60%. Further, the composition ratio of Zr/(Zr+Ti) is, more preferably, equal to or larger than 0.45 but less than 0.65. Moreover, the piezoelectric substance film can have any one of the tetragonal crystal, a pseudo cubic crystal and a rhombohedral crystal. Namely, the piezoelectric substance film may be structured solely of the tetragonal crystal and may also be structured of a multiphase series crystal (mixed crystal) of the tetragonal crystal and the pseudo cubic crystal or a mixed crystal of the tetragonal crystal and the rhombohedral crystal. Moreover, the piezoelectric substance element is an element, wherein the piezoelectric substance film is an epitaxial mono-crystal film or a single-axis oriented film. Furthermore, a preferable value of [001] axial length/[100] axial length is equal to or larger than 1.005 and equal to or smaller than 1.036, and more preferably equal to or larger than 1.015 and equal to or smaller than 1.029. The PZT film may contain an inorganic element as a dopant. The dopant can be exemplified such as Nb, La, Ca, Sr, Sb, Mo, W, Fe, Ni and Co.

Figure 1:
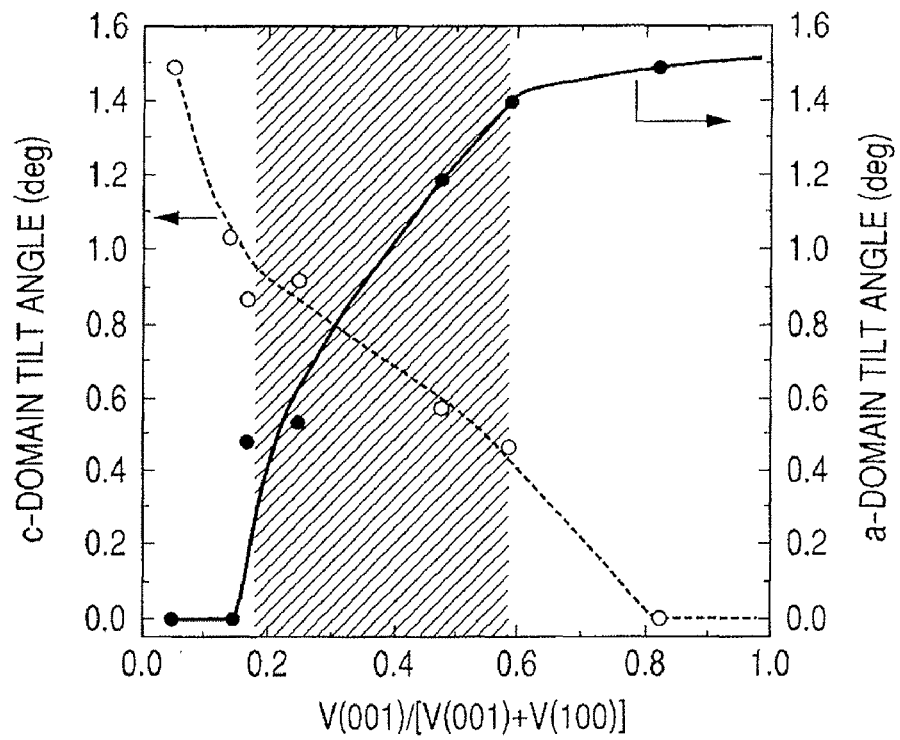
FIG. 1 is a graph showing tilt angles of a [100] axis and a [001] axis by way of one example of a piezoelectric substance film according to the present invention, wherein the axis of abscissa represents ratio of a volume [V(001)] of a (001) plane structure that occupies a volume total [V(001)+V(100)] of the (001) plane structure and a (100) plane structure.

A tilt angle of each of the a-domain and the c-domain with respect to the substrate surface will be explained with reference to FIG. 1. In FIG. 1, the axis of abscissa represents a volume rate of the c-domain to the total of the a-domain and the c-domain, and the axis of ordinate represents an a-domain tilt angle and a c-domain tilt angle (the left-sided axis of ordinate indicates the c-domain tilt angle, while the right-sided axis of ordinate indicates the a-domain tilt angle). According to the present invention, when the volume rate of the c-domain to the total of the a-domain and the c-domain is equal to or larger than 20% and equal to or smaller than 60%, as shown in FIG. 1, it is preferable that each of the a-domain and the c-domain has a tilted structure. It is understood from FIG. 1 that the c-domain is tilted at an angle of approximately 0.4° through approximately 1.0°. Further, similarly it is understood that the a-domain is tilted at an angle of approximately 0.3° through approximately 1.4°. It is considered that as the axis is thus tilted, the domain takes an easy-to-move structure as the piezoelectric substance element. Moreover, if the tilt angle becomes as wide as over, e.g., 10°, the crystal control gets hard to conduct, and the piezoelectric substance film comes to have a polycrystalline structure, which is considered unpreferable. Namely, according to the present invention, it is required that the piezoelectric substance film has the a-domain and the c-domain within the range of ±10° with respect to the surface of the substrate; however, it is preferable that the tilt angle thereof is equal to or larger than 0.2° and equal to or smaller than 10°.

Figure 2:
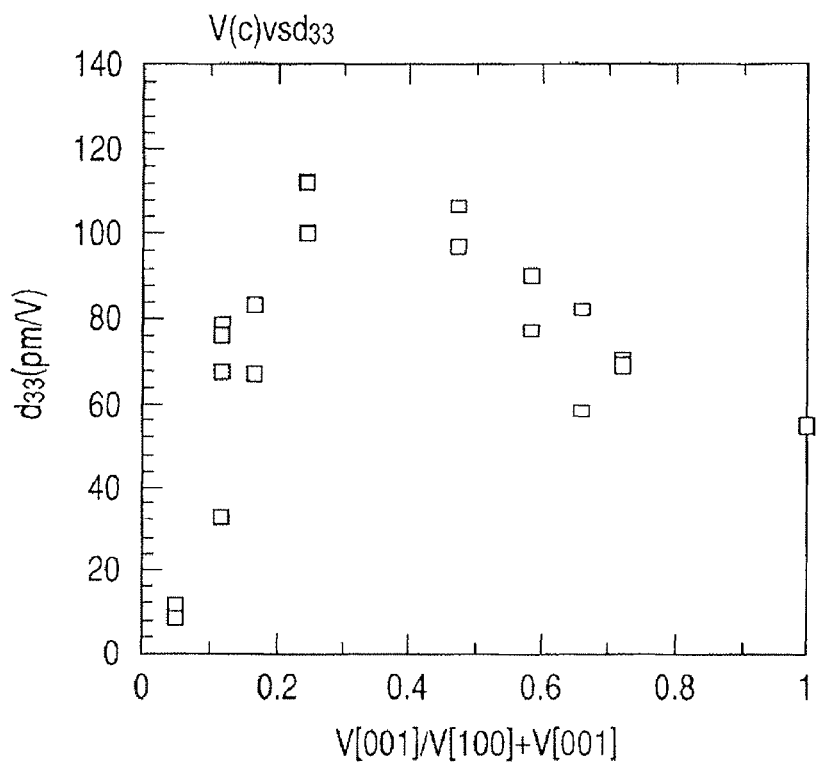
FIG. 2 is a graph showing a relationship between a volume rate of a c-domain to a total of an a-domain and the c-domain and a constant d in one example of the piezoelectric substance film according to the present invention.

FIG. 2 shows a relationship between the piezoelectric constant $d_{33}$ and the volume rate of the c-domain to the total of the a-domain and the c-domain in one example of the piezoelectric substance film according to the present invention. It is recognized that the volume rate is as high as being equal to or larger than 20% and equal to or smaller than 60%. The composition of the piezoelectric substance film in FIG. 2 corresponds to a case in which the composition ratio of Zr/(Zr+Ti) is 0.5 and the film thickness is on the order of 2.0 μm, however, if this composition ratio is over 0.4 but less than 0.7, the same tendency is exhibited. Further, though FIG. 2 shows the relationship with the piezoelectric constant $d_{33}$, it is also confirmed that the volume rate is similarly high with respect to the constant $d_{31}$ in the range given above.

Herein, the epitaxial mono-crystal film or the single-axis oriented film according to the present invention indicates a film having a mono-crystalline azimuth in the film thickness direction and an intra film plane direction, or in the film thickness direction by making use of crystallinity of the substrate or a lower-layer film (e.g., a lower electrode film). For example, SRO (ruthenium acid strontium) taking a perovskite type structure and PZT are as close as 4 Å in their lattice constant. Such being the case, after the SRO having the (100) plane with respect to the substrate surface has been formed as the lower electrode film, and the PZT is formed as the piezoelectric substance film, at which time the PZT having, e.g., at least the tetragonal crystal a-domain and c-domain with respect to the substrate surface can be formed depending on the film forming condition. Thus, the film having the mono-crystalline azimuth in the film thickness direction and the intra film plane direction by making use of the crystallinity of the lower-layer film (e.g., the lower electrode film) is the epitaxial mono-crystal film or the single-axis oriented film according to the present invention.

Further, according to the present invention, the definition of the epitaxial mono-crystal film or the single-axis oriented film is in a broad sense applied to a case in which a plurality of morphotropic phases such as the tetragonal crystal, the pseudo cubic crystal and the rhombohedral crystal exists in mixture (multiphase), a case in which the crystals derived from the twinning, etc., exist in mixture and a case of containing a transition, a defect, etc. This is because the piezoelectric substance film can have at least the tetragonal crystal a-domain and c-domain within the range of ±10° with respect to the substrate surface even in the case where these phases and the twining crystal exist in mixture.

The following are next confirmation methods that will be explained herein. A confirmation method (1) is a method of confirming the a-domain and the c-domain according to the present invention. A confirmation method (2) is a method of confirming the morphotropic phase. A confirmation method (3) is a method of confirming the twinning structure. A confirmation method (4) is a method of confirming the volume rate of the c-domain to the total of the a-domain and the c-domain. A confirmation method (5) is a method of confirming the epitaxial mono-crystal film or the single-axis oriented film. A confirmation method (6) is a method of confirming the composition ratio of Zr/(Zr+Ti).

Figure 7:
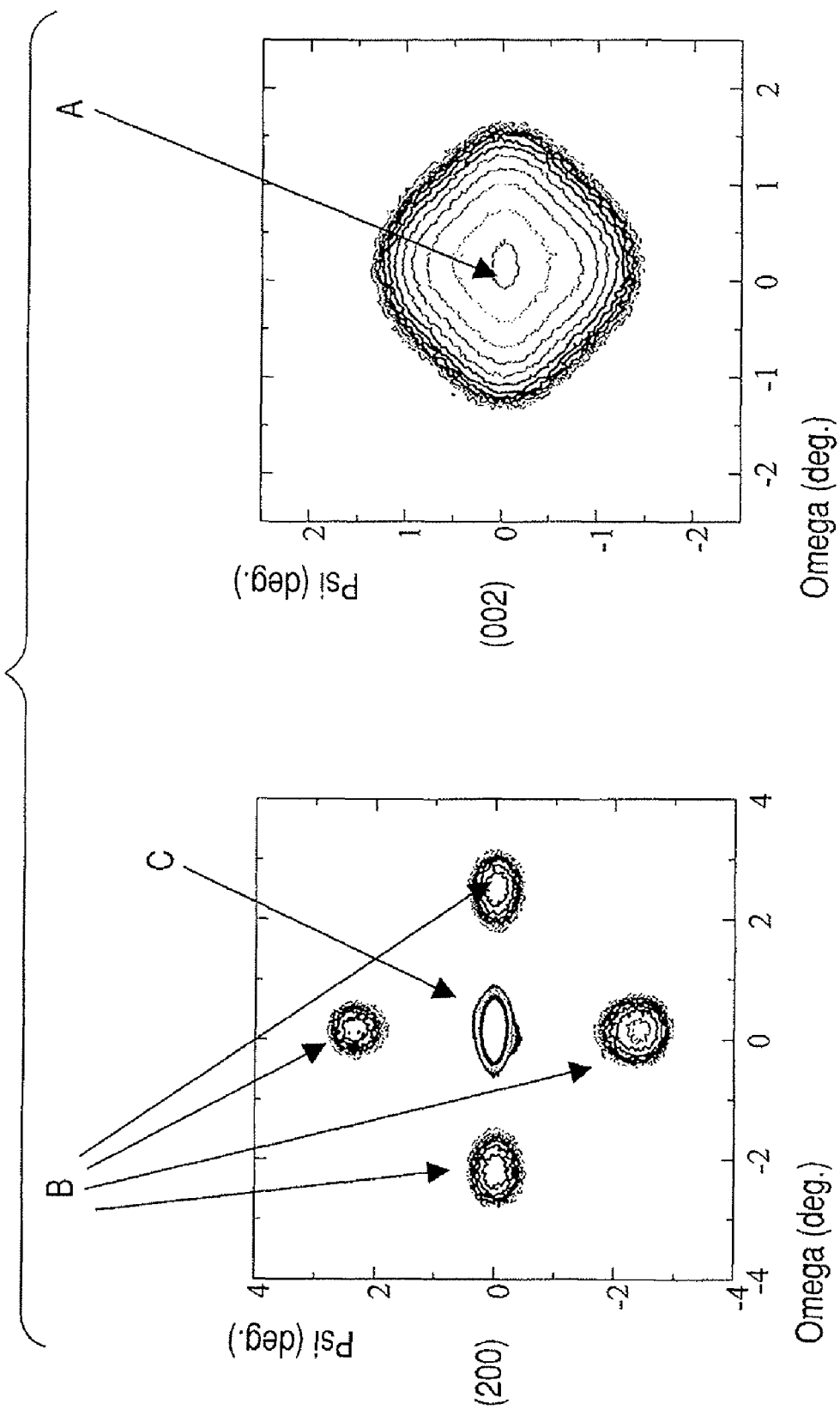
FIG. 7 is a diagram showing results of performing pole measurement over a PZT(002) plane and a PZT(200) plane by X-ray diffraction.

To start with, the a-domain and the c-domain, the twining structure and the volume rate can be confirmed by a reciprocal space mapping method of X-ray analysis and a pole measurement method over a symmetric plane as illustrated in FIG. 7. Furthermore, the measurement can be done by a method disclosed in Japanese Patent Application Laid-Open Publication No. 2003-98124. A change to the c-domain from the a-domain when applying the electric field can be confirmed by performing the aforementioned X-ray diffraction under the application of the electric field. Moreover, the morphotropic phase can be judged from the reciprocal space mapping method of the X-ray analysis. The epitaxial mono-crystal film or the single-axis oriented film can be confirmed by an X-ray analysis θ-2θ method, a rocking curve method and an asymmetric plane pole measurement method. As described above, the crystalline structure of the piezoelectric substance film can be easily confirmed by the X-ray diffraction and may also be confirmed by sectional observation, etc., that uses, e.g., a transmission electron microscope (TEM) in addition to the X-ray diffraction described above. Further, the composition ratio of Zr/(Zr+Ti) can be confirmed by composition analysis (ICP composition analysis) employing an inductively coupled plasma spectrochemical analysis apparatus and by fluorescent X-ray analysis.

Figure 3:
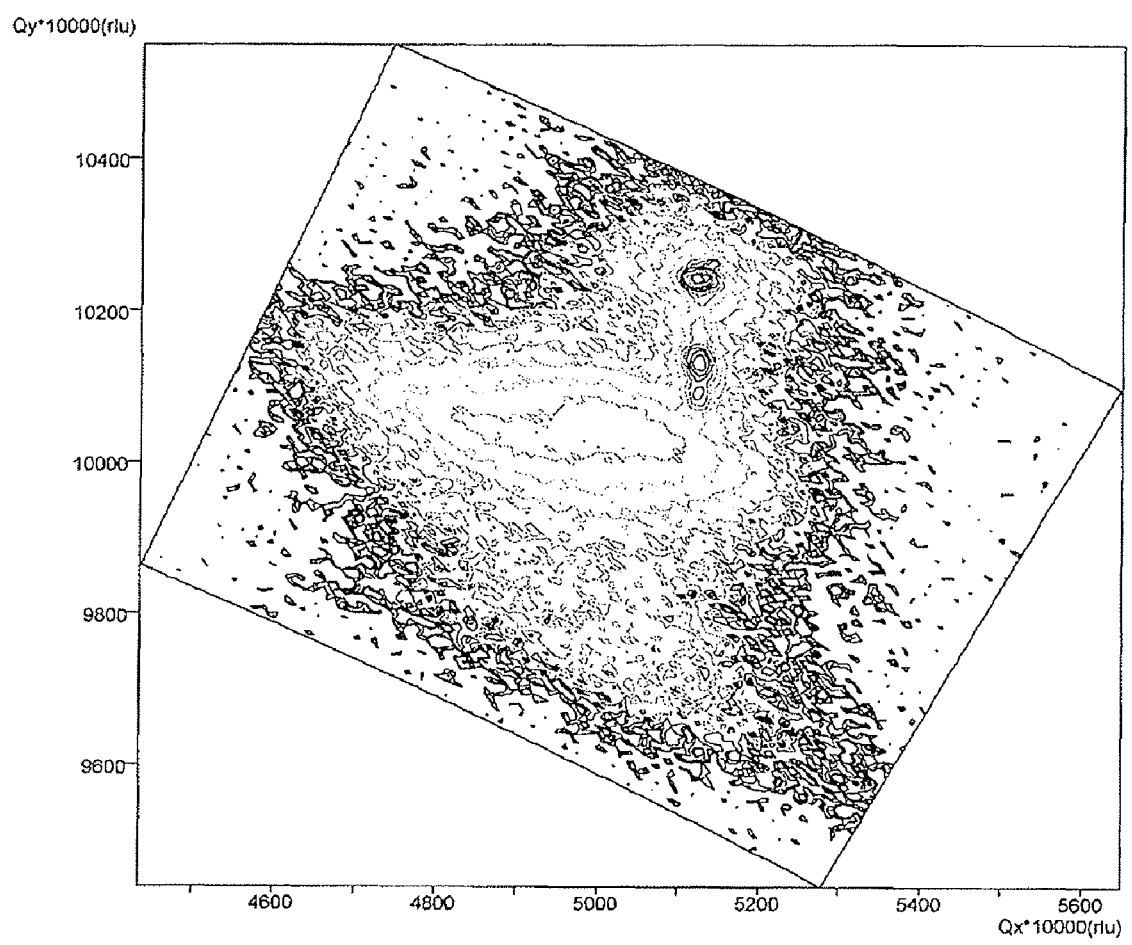
FIG. 3 is a view showing an reciprocal space map in one example of the piezoelectric substance film according to the present invention.
Figure 4:
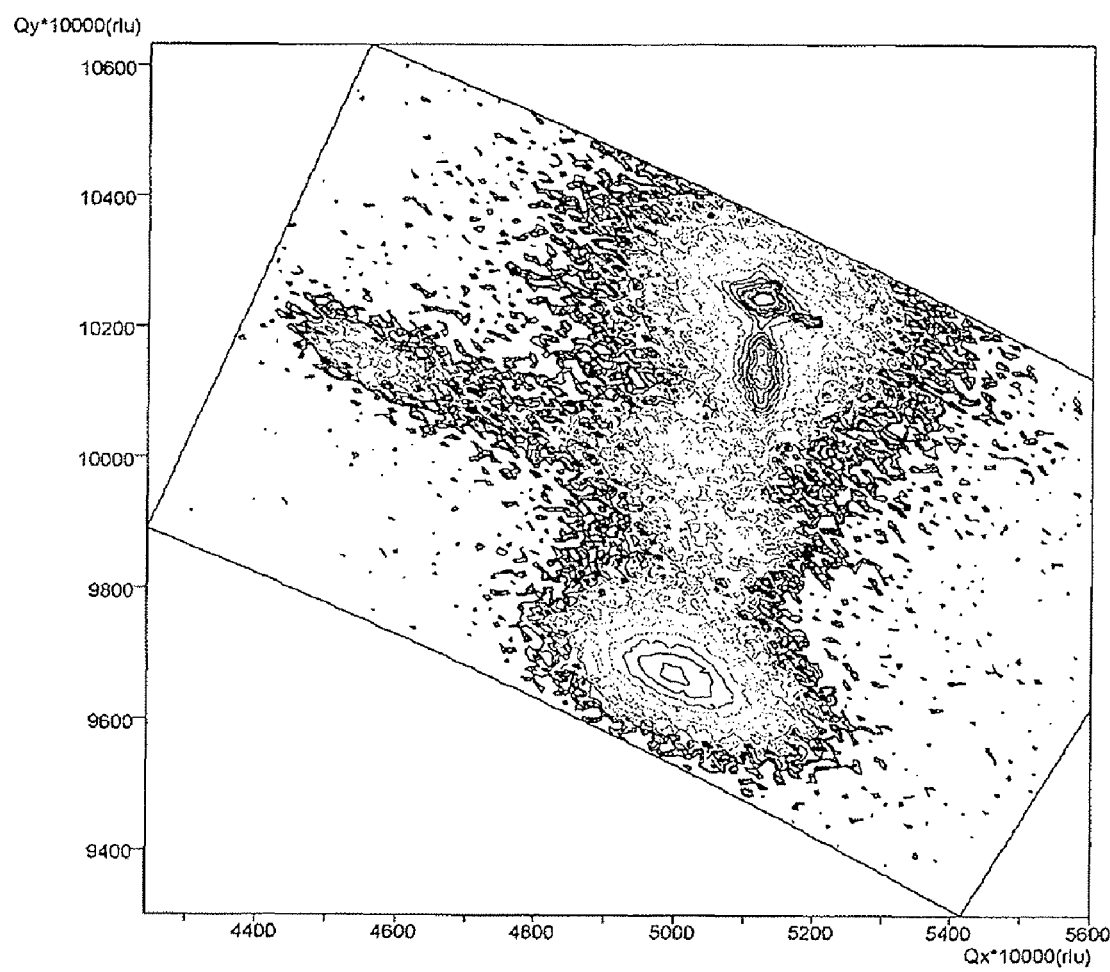
FIG. 4 is a view showing the reciprocal space map in one example of the piezoelectric substance film according to the present invention.

FIGS. 3 and 4 show one example of the a-domain, the c-domain and the twinning structure. FIG. 3 shows a result of performing the reciprocal space mapping method of a PZT (204) plane by the X-ray diffraction. It is recognized from the Figures that the a-domain and the c-domain exist and are in the twinning enantiomorphic relationship. Further, FIG. 4 similarly shows a result of conducting the reciprocal space mapping measurement over the PZT (204) plane by the X-ray diffraction. A state of the c-domain is distinguished in the Figures. A black circle represents a peak fission point attributed to the twinning structure of the a-domain.

Figure 8:
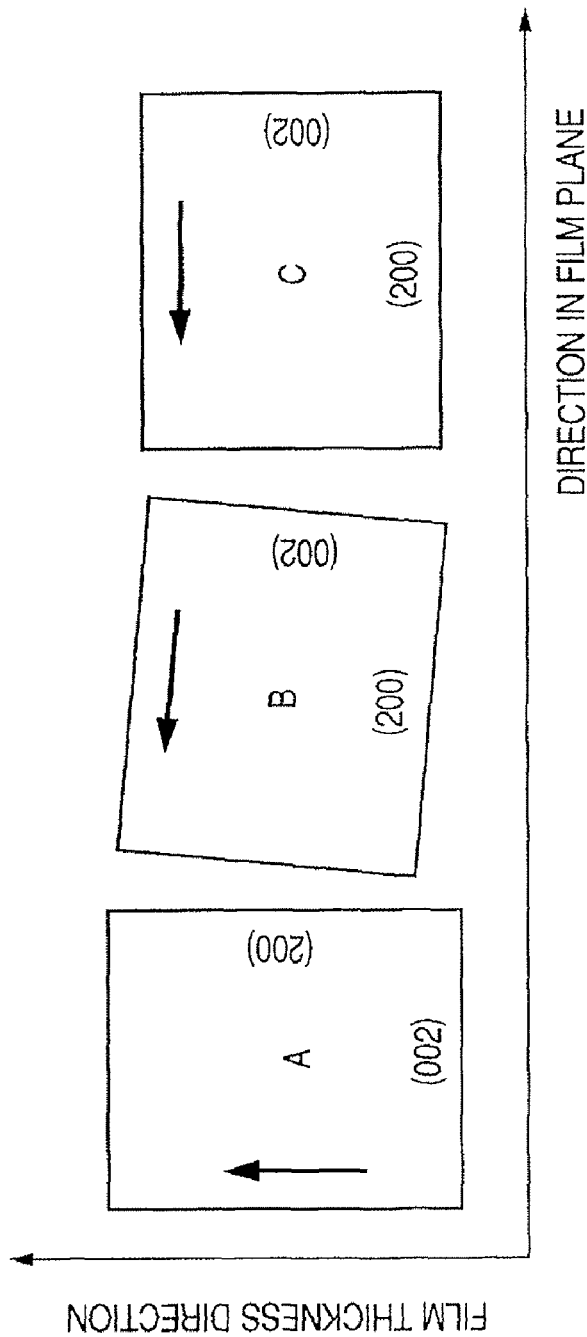
FIG. 8 is a diagram showing crystal inclinations (tilts) to film thickness directions of A, B and C that can be confirmed from the pole diagram in FIG. 7.
Figure 9:
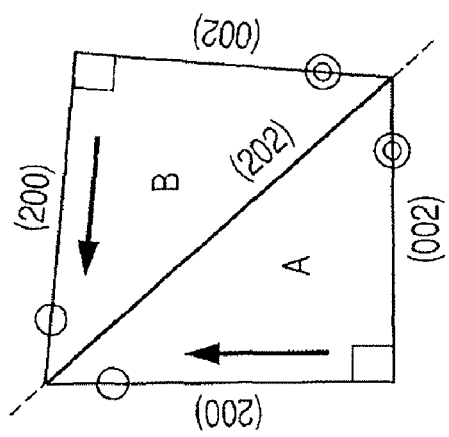
FIG. 9 is a diagram showing that A and B are in a twinning enantiomorphic relationship where a (202) plane is a twinning plane.

Furthermore, FIG. 7 similarly shows one example of the a-domain, the c-domain and the twinning structure. FIG. 7 shows a result of executing the pole measurement over a PZT (002) plane and a PZT(200) plane in the X-ray diffraction. A measurement range is a range having an inclination that is approximately 2° from the film thickness direction (a direction of the PZT [001] axis) of the piezoelectric substance film. As shown in FIG. 7, existence of reciprocal lattice points A, B and C due to the PZT (002) plane and the PZT(200) plane can be confirmed in a pole diagram. It can be herein confirmed from the pole diagram in FIG. 7 that A, B and C are respectively two-dimensionally tilted in their crystals to the film thickness direction as illustrated in FIG. 8. By the way, A and B shown in FIG. 8 are in the twinning enantiomorphic relationship, wherein a (202) plane is, as illustrated in FIG. 9, the twinning plane. Herein, arrowheads in FIGS. 8 and 9 correspond to the [001] axis direction. Hence, it follows that a [001] axis azimuth deviation between the reciprocal lattice points A and B in FIG. 7 is a magnitude that is approximately twice as large as an angle taking a tangential relationship with [001] axial length/[100] axial length of the crystal lattices. Herein, if the main component of the piezoelectric substance film is Pb(Zr, Ti)$O_3$, a unit lattice thereof is comparatively close to a cube. Therefore, the aforementioned slight deviation occurred due to the twinning is a few degrees (which is approximately 2° in the case of FIG. 7) smaller than about 90°. Namely, the reciprocal lattice point A in FIG. 7 appears to be a result of observing the c-domain of the present invention, in which the piezoelectric substance film has the tetragonal crystal (001) plane in a position of approximately 0° to the substrate surface. Similarly, the reciprocal lattice point B in FIG. 7 appears as a result of observing the a-domain of the present invention, in which the piezoelectric substance film has the tetragonal crystal (100) plane in a position of approximately ±2° to the substrate surface. Further, similarly, the reciprocal lattice point C in FIG. 7 appears as a result of observing the a-domain of the present invention, in which the piezoelectric substance film has the tetragonal crystal (100) plane in a position of approximately 0° to the substrate surface. Still further, the reciprocal lattice points A and B are in the twinning enantiomorphic relationship in which the (202) plane is the twinning plane. Moreover, the reciprocal lattice points A and C are in a complete 90-degree domain, wherein A and C are not in the twinning enantiomorphic relationship. The pole diagram in the X-ray diffraction in FIG. 7 exemplifies the result of performing the pole measurement over the PZT(002) plane and the PZT(200) plane, however, the pole measurement may also be similarly conducted over, e.g., a PZT(004) plane and a PZT(400) plane as well as over the PZT(001) plane and the PZT(100) plane. At this time, the reciprocal lattice points A and B are in the twinning enantiomorphic relationship in which the (101) plane and the (404) plane are twining planes. The twinning planes of the reciprocal lattice points A and B in FIG. 7 differ in their representations, depending on the planes over which to conduct the pole measurement in the X-ray diffraction, however, the (101) plane, the (202) plane, the (303) plane, the (404) plane and the (N0N) (N is an integer) plane are the same in their azimuths of the crystal planes, and hence A and B are in the same twinning enantiomorphic relationship.

Furthermore, the volume rate according to the present invention can be computed by use of the results of conducting the pole measurement over, for example, the PZT(002) plane and the PZT(200) plane in the X-ray diffraction in FIG. 7. The volume rate of the c-domain to the total of the a-domain and the c-domain connotes an A's integrated intensity with respect to a total of integrated intensities of A, B and C in FIG. 7.

The piezoelectric substance film can be obtained by the method of forming the film over the substrate, wherein a substrate temperature is set equal to or higher than 300° C. and equal to or lower than 550° C. The film is formed, wherein the substrate temperature is set, preferably, equal to or higher than 350° C. and equal to or lower than 490° C. Thereafter, an anneal treatment is effected in oxygen at a temperature that is higher by over 100° C., preferably, over 200° C. than the film forming temperature, and more preferably at a temperature equal to or higher than 450° C. and equal to or lower than 850° C., much more preferably, at a temperature equal to or higher than 520° C. and equal to or lower than 800° C. With such a method adopted, in the case of employing a Si substrate, etc., as the substrate, the piezoelectric substance film receives a tensile stress, whereby the volume rate of the c-domain to the total of the a-domain and the c-domain can be decreased.

When forming the film at the substrate temperature higher than the temperatures given above, for instance, at a temperature equal to or higher than 600° C., it follows that the film becomes such a type of film that the a-domain is extremely small. In this film, the domain ratio cannot be changed even by effecting the anneal treatment after the film formation. Thus, the anneal treatment is executed in the oxygen; however, it is preferable that this anneal treatment is done in a Pb atmosphere when at a temperature as high as over 650° C. A period of treatment time is preferably equal to or longer than 10 min but less than 3 hours. Formation of the Pb atmosphere can be attained by disposing a compound, i.e., PZT containing Pb, in a predetermined position in a heating area. Specific film forming means for the piezoelectric substance film can be exemplified such as a MO-CVD (Metal Organic Chemical Vapor Deposition) method, a sputtering method, a sol-gel method, a hydrothermal synthesis method, an MBE (Molecular Beam Epitaxial) method and a PLD (Pulsed Laser Deposition) method. In these methods, the MO-CVD method is preferable. A preferable method is particularly a method of intermittently supplying a raw gas, which is disclosed in Japanese Patent Application Laid-Open No. 2001-220676. Further, it is preferable that the MO-CVD method involves using a material exhibiting a high soaking property for a nozzle that supplies the raw gas.

The following are materials that are preferably utilized as the raw materials used for the MO-CVD method. Note that a radical of $((CH_3)_3CCO_2)_2CH$ is expressed by thd. The Pb raw material can be exemplified such as $Pb(C_2H_5)_4$, $Pb(thd)_2$, $Pb(thd)$ $(OC_2H_5)_2$, $(C_2H_5)_3PbOCH_2C(H_3)_3$, $Pb(C_2H_5)_3$ $(OC_4H_9\text{-}t)$, $Pb(C_6H_5)_4$ and $PbCl_2$. A Zr raw material can be exemplified such as $Zr(OC_4H_9\text{-}t)_4$, $Zr(i\text{-}C_3H_7)_4$, $Zr(OC_2H_5)_4$, $Zr(OCH_3)_4$ and $Zr(OC_5H_{11}\text{-}n)_4$. A Ti raw material can be exemplified such as $Ti(OC_3H_7\text{-}i)_4$, $Ti(thd)_2(OC_3H_7\text{-}i)_2$, $Ti(OC_2H_5)_4$, $TiCl_4$, $Ti(OCH_3)_4$ and $Ti(OC_5H_{11})_4$.

Moreover, part of Pb of PZT can be replaced with La, etc.; however, a raw material in this case involves using $La(thd)_3$, $La(C_2H_3O_2)_4$, $LaCl_3$ and so on. Further, as for the PZT composition, the Zr-to-Ti composition ratio is set as described. However, Pb may be excessive in quantity with respect to a B site element such as Zr and Ti.

As the substrate formed with the piezoelectric substance film, a preferable substrate is a glass substrate or a Si substrate on which a buffer layer and an electrode layer are formed.

A preferable buffer layer is a layer on which a film composed of a perovskite type oxide, e.g., an SRO (100) or SRO (001) film can be formed as the electrode layer. The piezoelectric substance film composed of a PZT perovskite film exhibiting good crystalline controllability can be acquired through a $SrRuO_3$ (SRO) film. The preferable buffer layer can be exemplified by a fluorite oxide film and/or a magnesia spinel film such as a YSZ(100) film or a $MgAl_2O_4$(001) film. If, for instance, a MgO(100) mono-crystalline substrate is employed as the substrate, as described above, it follows that the film becomes a film having the large c-domain or a polycrystalline film. According to the present invention, other than the Si substrate and the glass substrate, a $SrTiO_3$ substrate, a sapphire substrate and a $KTaO_3$ substrate may also be employed; however, the glass substrate and the Si substrate are preferable in terms of manufacturing the device. The buffer layer on the substrate can be formed by use of a metal oxide such as YSZ(Y-doped $ZrO_2$), STO($SrTiO_3$), MgO, $MgAl_2O_4$ and $CeO_2$, and/or can be also formed by employing a face-centered cubic structure metal, a hexagonal close-packed structure metal and a body-centered cubic structure metal such as Pt, Ir, Ru, Ti and Ta.

The electrode layer can be made from a conductive metal oxide such as SRO($SrRuO_3$), LNO($LaNiO_3$), LSCO($LaSrCoO_3$), $CaRuO_3$, $SrCrO_3$ and $LaCuO_3$. It is preferable that the electrode layer be composed of the perovskite type oxide. One of the upper and lower electrodes of the piezoelectric substance element may involve using the conductive oxide taking the perovskite type structure such as the SRO film; however, in addition to this film, metallic materials such as a metal material having the hexagonal close-packed structure, a metal material having the face-centered cubic structure and a metal material having the body-centered cubic structure, are preferably used. The film thickness of the electrode is 50 nm through 600 nm and, preferably, 100 nm through 300 nm.

The crystalline orientation of each of these layers is (100) or (001) in the case where the electrode layer and the buffer layer are the metal oxide layers and is (111) in the case where the buffer layer is the metal layer. The film thickness of each of the layers described above can be selected from within a range of being equal to or larger than 10 nm and equal to or smaller than 800 nm.

The method of controlling the volume rate of the c-domain to the total of the a-domain and the c-domain adopts the method of controlling the film forming temperature and the anneal temperature described above, and, with the exception of this method, there may be adopted a method of controlling the volume rate with a stress applied on the film by making use of a thermal expansion coefficient of the substrate. To attain this, it is also effective to adjust the film thickness of each of the layers in order to effectively use the thermal expansion coefficients of the buffer layer and the electrode layer.

(Liquid Discharge Head and Liquid Discharge Apparatus)

Given next is an explanation of a liquid discharge head according to the present invention.

The liquid discharge head according to the present invention is a liquid discharge head characterized by including the piezoelectric substance element described above and discharging the liquid by use of the piezoelectric substance element.

To show a specific example of configuration, the liquid discharge head has a discharge port, an individual liquid chamber communicating with the discharge port, a diaphragm configuring part of the individual liquid chamber, and a piezoelectric substance element for giving vibrations to the diaphragm provided outside the individual liquid chamber. In this liquid discharge head, the liquid in the individual liquid chamber is discharged by dint of a change in volume within the individual liquid chamber, which occurs due to the diaphragm. Then, this liquid discharge head is characterized by using the piezoelectric substance element having the configuration described above as the piezoelectric substance element.

It is possible to readily obtain the liquid discharge head capable of exhibiting uniform and high discharge performance by employing the piezoelectric substance film element (piezoelectric substance element) according to the present invention and capable of attaining a discharge pressure generation element hyperfine-structured pattern including the piezoelectric substance film element. The liquid discharge head according to the present invention may be employed for image forming apparatuses such as an inkjet printer, a facsimile, a multi-function machine and a copying machine, or for industrial discharge apparatuses that discharge liquids other than the inks.

Figure 10:
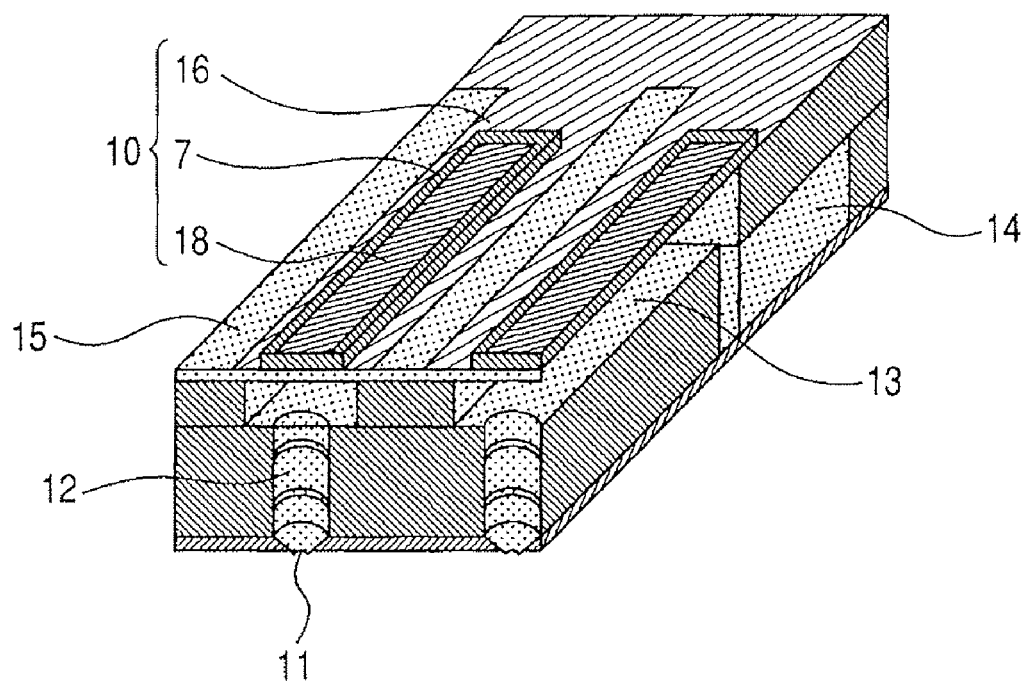
FIG. 10 is a schematic view of a liquid discharge head.

The liquid discharge head according to the present invention will be explained with reference to FIG. 10. FIG. 10 is a schematic diagram showing one example of an embodiment of the liquid discharge head according to the present invention. The liquid discharge head in the embodiment illustrated in FIG. 10 includes a discharge port 11, a communicating hole 12 for communicating the discharge port 11 and the individual liquid chamber 13 with each other, and a common liquid chamber 14 for supplying the liquid to the individual liquid chamber 13, and the liquid is supplied to the discharge port 11 along a communicating path. A diaphragm 15 configures part of the individual liquid chamber 13. The piezoelectric substance film element 10 for giving the vibrations to the diaphragm 15 is provided outside the individual liquid chamber 13. When the piezoelectric substance film element 10 is driven, the diaphragm 15 is given the vibrations by the piezoelectric substance film element 10 with the result that a change in volume within the individual liquid chamber 13 is caused, whereby the liquid within the individual liquid chamber 13 is discharged from the discharge port. The piezoelectric substance film element 10 takes a rectangular shape in an embodiment illustrated in FIG. 11 that will be described later on, however, this configuration may also be shapes such as an elliptic, a circle and a parallelogram.

Figure 11:
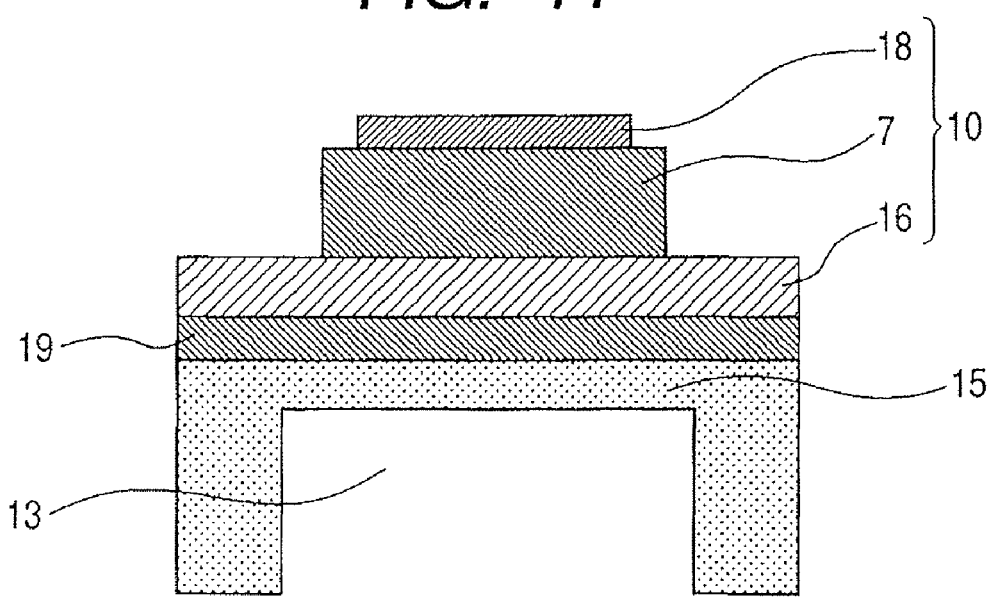
FIG. 11 is a sectional schematic view of the liquid discharge head as viewed in a crosswise direction thereof.

FIG. 11 shows a sectional schematic diagram of the liquid discharge head in a crosswise direction. The piezoelectric substance film element 10 configuring the liquid discharge head according to the present invention will be described in greater detail with reference to FIG. 11. A sectional shape of the piezoelectric substance film element 10 is illustrated in a rectangle and may also be a trapezoid and an inverted trapezoid. Further, in FIG. 11, a first electrode film corresponds to a lower electrode film 16, and a second electrode film corresponds to an upper electrode film 18, however, the first electrode film and the second electrode film, which configure the piezoelectric substance film element 10, may be either the lower electrode film 16 or the upper electrode film 18. This arrangement depends on the manufacturing method when assembling the device, and the effects of the present invention can be acquired in either case. Moreover, the diaphragm 15 may be constructed from the substrate configuring the piezoelectric substance film element 10 according to the present invention. Further, a buffer layer 19 may be provided between the diaphragm 15 and the lower electrode film 16.

Figure 12:
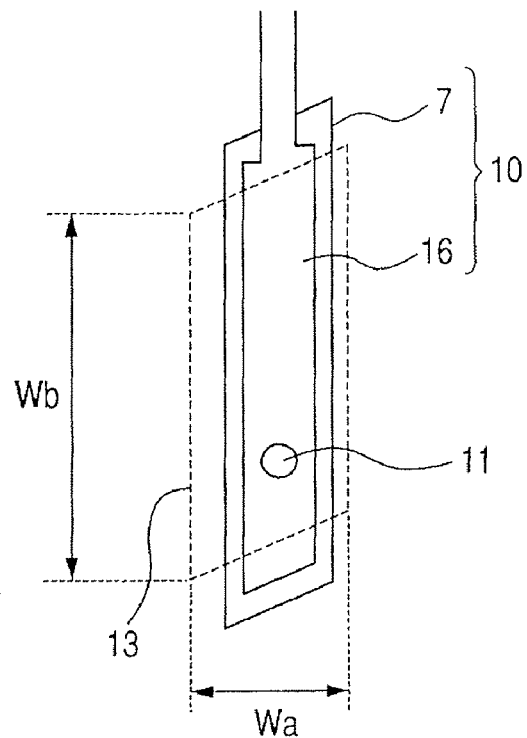
FIG. 12 is a schematic view of the liquid discharge head as viewed from an upper surface side.
Figure 13:
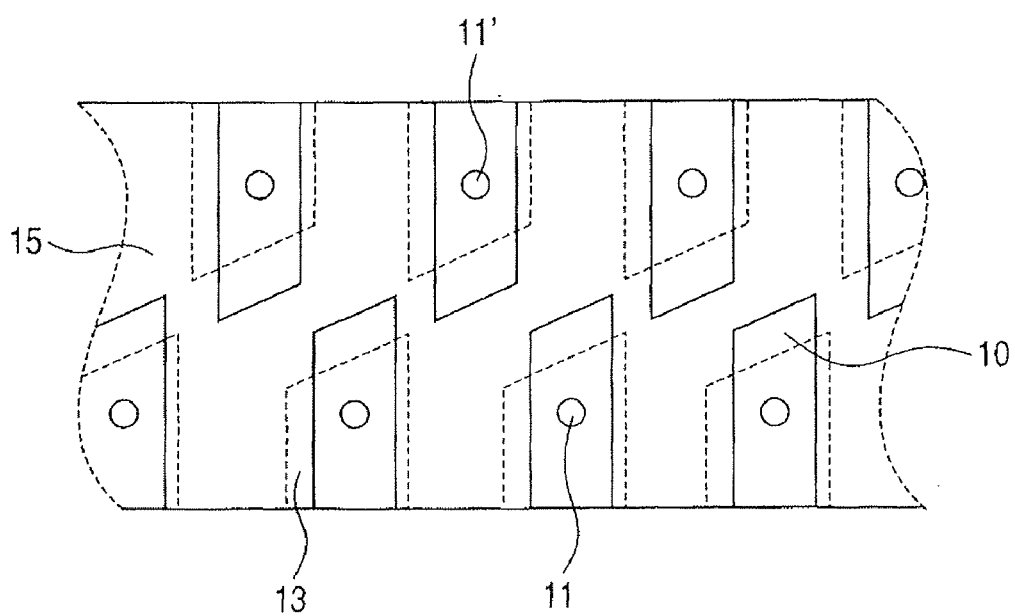
FIG. 13 is a schematic view of the liquid discharge head as viewed from the upper surface side.

FIGS. 12 and 13 are schematic diagrams of the liquid discharge head shown in FIG. 10 as viewed from an upper surface side (a side of the discharge port 11). An area depicted by a broken line represents the individual liquid chamber 13 onto which the pressure is applied. The piezoelectric substance film element 10 is properly subjected to the patterning and thus formed on the individual liquid chamber 13. For instance, in FIG. 12, the lower electrode film 16 is led to an area where none of the piezoelectric substance film 7 exists, and the upper electrode film 18 (unillustrated) is led out on the side opposite to the lower electrode film 16 and is thus connected to a driving source. FIGS. 12 and 13 illustrate a state where the lower electrode film 16 is subjected to the patterning but may exist, as shown in FIG. 11, in an area where the piezoelectric substance film 7 does not exist. The piezoelectric substance film 7, the lower electrode film 16 and the upper electrode film 18 can be subjected to the patterning optimally in accordance with a purpose in terms of driving the piezoelectric substance film element 10 if there are no such troubles as short-circuiting and disconnection between a drive circuit and the piezoelectric substance film element 10. Further, the reason why the shape of the individual liquid chamber 13 is illustrated as the parallelogram is that the shape of the individual liquid chamber 13, when the individual liquid chamber is formed by conducting alkali-based wet etching with the Si(110) substrate being used as the substrate, becomes such a configuration (parallelogram). The shape of the individual liquid chamber 13 may be a rectangle and a square other than the parallelogram. Generally, a plurality of individual liquid chambers 13 is formed at a fixed pitch count on the diaphragm 15, however, as shown in FIG. 13, the individual liquid chambers 13 may be arranged in zigzag alignment, and the single individual liquid chamber 13 may also be provided depending on the purpose.

A thickness of the diaphragm 15 is normally 0.5 μm-10 μm and, preferably, 1.0 μm-6.0 μm. This thickness includes, if the buffer layer 19 is provided, a thickness of the buffer layer. Further, a plurality of layers excluding the buffer layer may also be formed. For example, there may be included an etch stopping layer needed for such a case that the diaphragm and the individual liquid chamber are formed from the same substrate. A width Wa (see FIG. 12) of the individual liquid chamber 13 is normally 30 μm-180 μm. A length Wb (see FIG. 12) is, though depending on a discharge liquid droplet quantity, 0.3 mm-6.0 mm. It is preferable that the discharge port 11 normally takes a circular shape or a star shape, and its diameter is normally set to 7 μm-30 μm. It is preferable that the discharge port 11 has a tapered shape in section, which is expanded toward the communication hole 12. It is preferable that a length of the communication hole 12 is normally 0.05 mm through 0.5 mm. If the length of the communication hole 12 is set equal to or smaller than 0.5 mm, a discharge speed of the liquid droplets becomes sufficiently high. Further, if set equal to or larger than 0.05 mm, a fluctuation of the discharge speed of the liquid droplets discharged from each discharge port gets small, which is a preferable aspect. Moreover, the members for building up the diaphragm, the individual liquid chamber, the common liquid chamber, the communication hole, etc. that configure the liquid discharge head according to the present invention, may be composed of the same material and may also be composed of materials different from each other. If the material is, e.g., Si, etc., the liquid discharge head can be worked by using a lithography method and an etching method. Furthermore, as the members selected if different, it is preferable that a difference in thermal expansion coefficient between these respective members is $1\times10^{-8}/°$ C. through $1\times10^{-6}/°$ C. It is preferable that, e.g., a SUS substrate, a Ni substrate, etc. are selected for the Si substrate. It is also preferable that the piezoelectric substance film element according to the present invention has at least the tetragonal crystal and is the <100> orientation epitaxial film; however, it is preferable that the crystalline azimuth in the intra film plane direction of the piezoelectric substance film in the liquid discharge head according to the present invention be the <100> azimuth in a longitudinal direction of the piezoelectric substance film. Note that this longitudinal direction corresponds to the Wb direction in FIG. 12.

Next, the liquid discharge head manufacturing method according to the present invention will be described. The liquid discharge head manufacturing method according to the present invention has at least the following steps.

(1) A step of forming the discharge port.
(2) A step of forming the communication hole that communicates the discharge port with the individual liquid chamber.
(3) A step of forming the individual liquid chamber.
(4) A step of forming the common liquid chamber communicating with the individual liquid chamber.
(5) A step of forming the diaphragm that gives the vibrations to the individual liquid chamber.
(6) A step of manufacturing the piezoelectric substance film element according to the present invention, which serves to give the vibrations to the diaphragm provided outside the individual liquid chamber.

To be specific, for example, the following method can be exemplified as a first method of manufacturing the liquid discharge head according to the present invention. Part of the individual liquid chamber and the diaphragm are formed by applying the step (3) on the substrate formed with the piezoelectric substance film element 10 in a way that applies the step (6) given above. The substrate formed with the communication hole and the common liquid chamber is manufactured by applying the steps (2) and (4), and the substrate having the discharge port is manufactured by applying the step (1), separately. Next, the liquid discharge head is manufactured by integrating the substrates with their substrate members in a way that stacks these substrate members.

Figure 14:
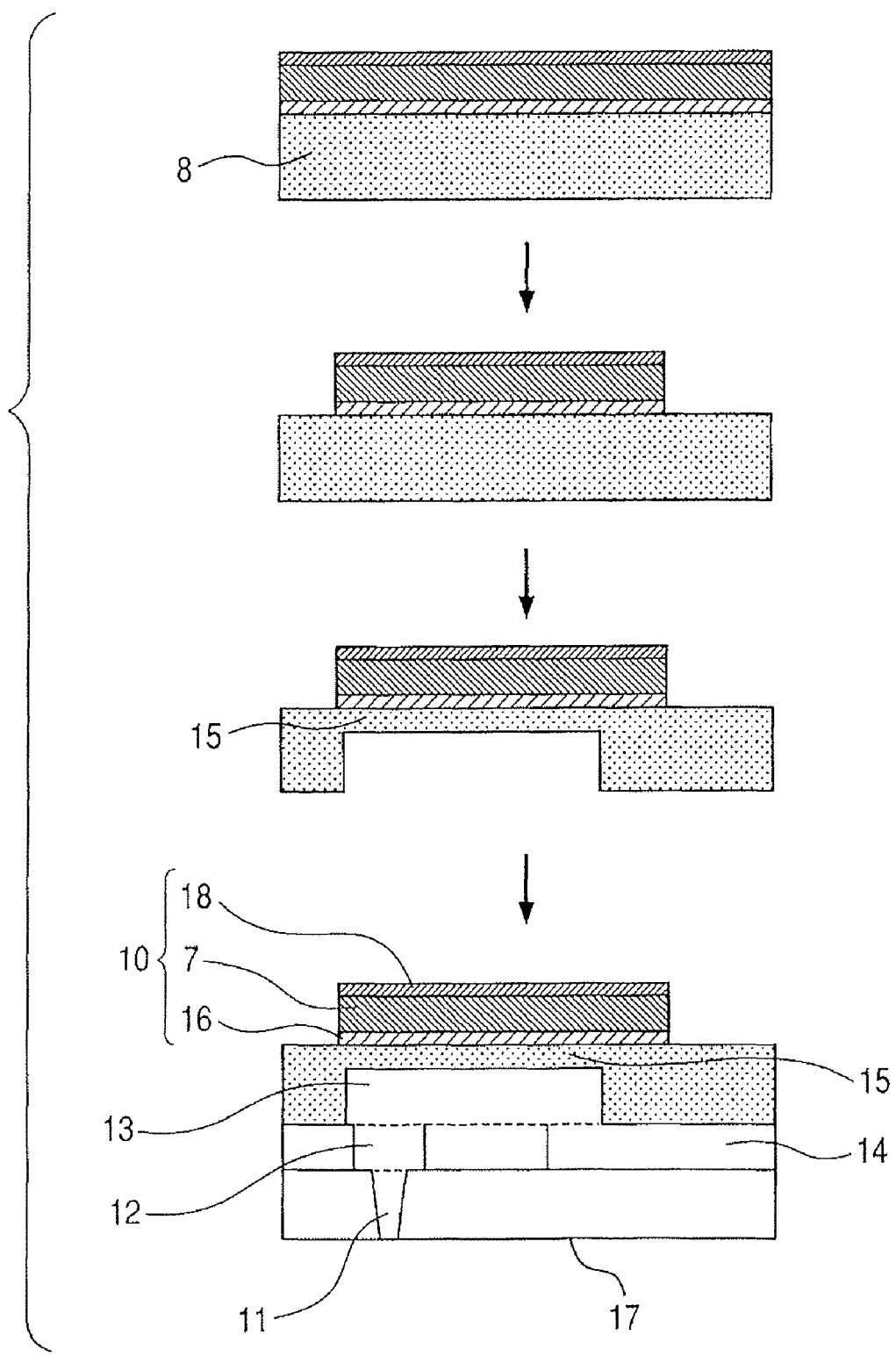
FIG. 14 is a view showing a liquid discharge head manufacturing method.

Further, the following method can be exemplified as a second method of manufacturing the liquid discharge head according to the present invention. To begin with, separately, at least, the substrate member to be formed with the individual liquid chamber or the substrate member formed with the individual liquid chamber is manufactured by applying the step (3). Next, the piezoelectric substance film element or the diaphragm and the piezoelectric substance film element is or are transferred onto this substrate member from the substrate formed with the piezoelectric substance film element by applying the step (6) or from the substrate formed with the diaphragm and the piezoelectric substance film element. Subsequently, the individual liquid chamber is formed by working, in a way that applies the step (2), at least the substrate member portion, on the side opposite to the piezoelectric substance film element etc., of the substrate member onto which the piezoelectric substance film element or the diaphragm and the piezoelectric substance film element is or are transferred. Moreover, in the same way as the first method described above, the substrate member formed with the communication hole and the common liquid chamber and the substrate member formed with the discharge port are manufactured, and the liquid discharge head is manufactured by stacking and thus integrating these substrate members. The first method involves, as shown in FIG. 14, at first, providing the piezoelectric substance film element 10 on the substrate 8 in the same way as the piezoelectric substance film element manufacturing method. Next, at least in the state where the piezoelectric substance film element 10 is subjected to the patterning, part of the substrate 8 is removed, and the diaphragm 15 is thus formed along with forming part of the individual liquid chamber 13. Separately, the substrate member having the common liquid chamber 14 and the communication hole 12 is manufactured, and further a substrate member 17 formed with the discharge port 11 is manufactured. Moreover, it is feasible to exemplify the manufacturing method of forming the liquid discharge head by integrating the substrate members in a way that stacks these substrate members. The method of removing part of the substrate 8 can be exemplified such as a wet etching method, a dry etching method or a sand mill method. Part of the substrate 8 is removed by such methods, whereby at least some of the diaphragm 15 and the individual liquid chamber 13 can be formed.

Figure 15:
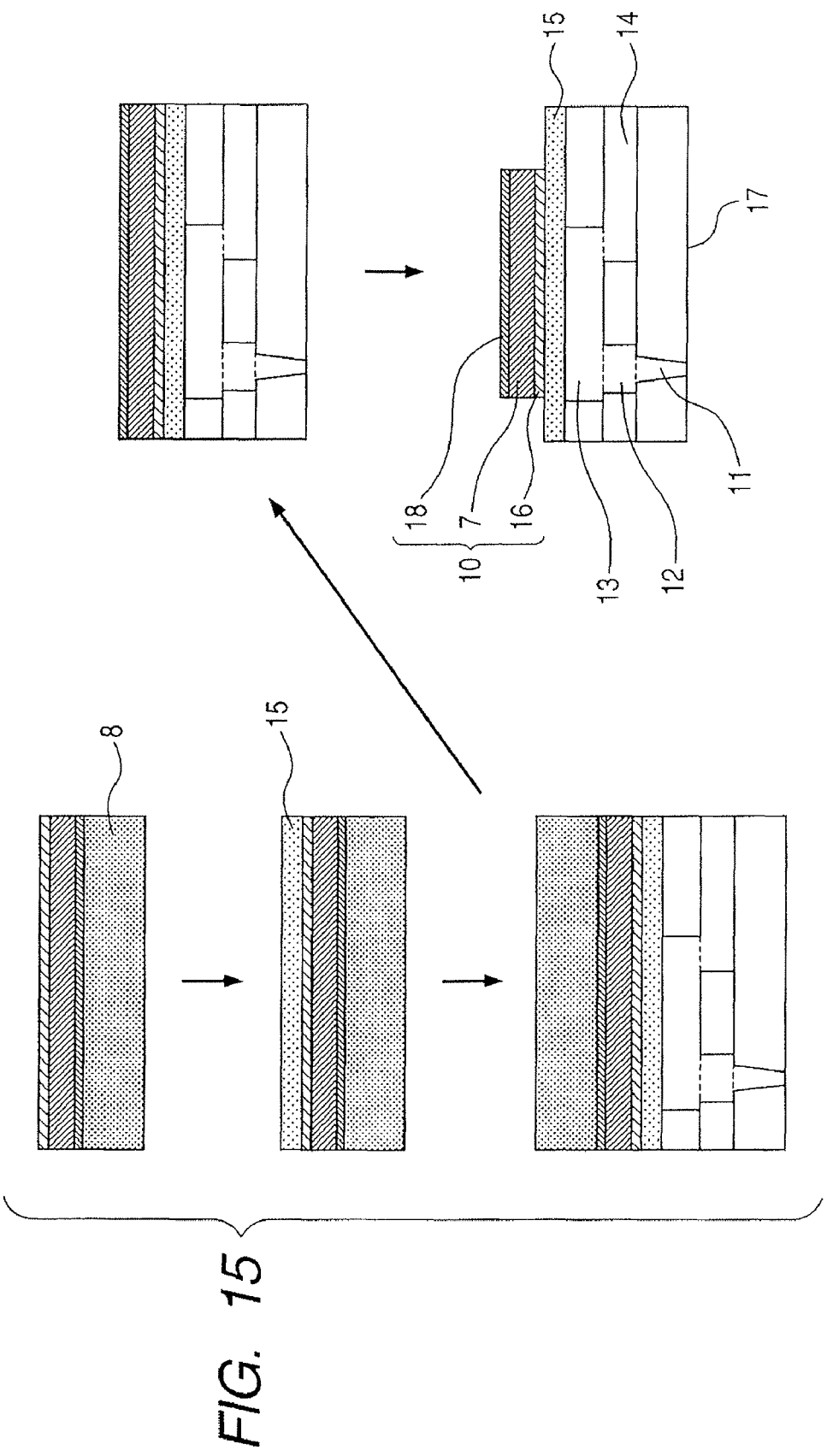
FIG. 15 is a view showing the liquid discharge head manufacturing method.

The second method is, for example, as shown in FIG. 15, that, to start with, the piezoelectric substance film element 10 is provided on the substrate 8 in the same way as the piezoelectric substance film element manufacturing method. Next, in the state where the piezoelectric substance film element 10 is not subjected to the patterning, the substrate with the diaphragm 15 grown on the piezoelectric substance film element is manufactured. Further, it is possible to exemplify such a manufacturing method that the substrate member provided with the individual liquid chamber 13, the substrate member provided with the communication hole 12 and the common liquid chamber 14 and the substrate member 17 provided with the discharge port 11, are manufactured, and, after stacking these substrate members, the diaphragm, the piezoelectric substance film element, etc., are transferred from the substrate.

Figure 16:
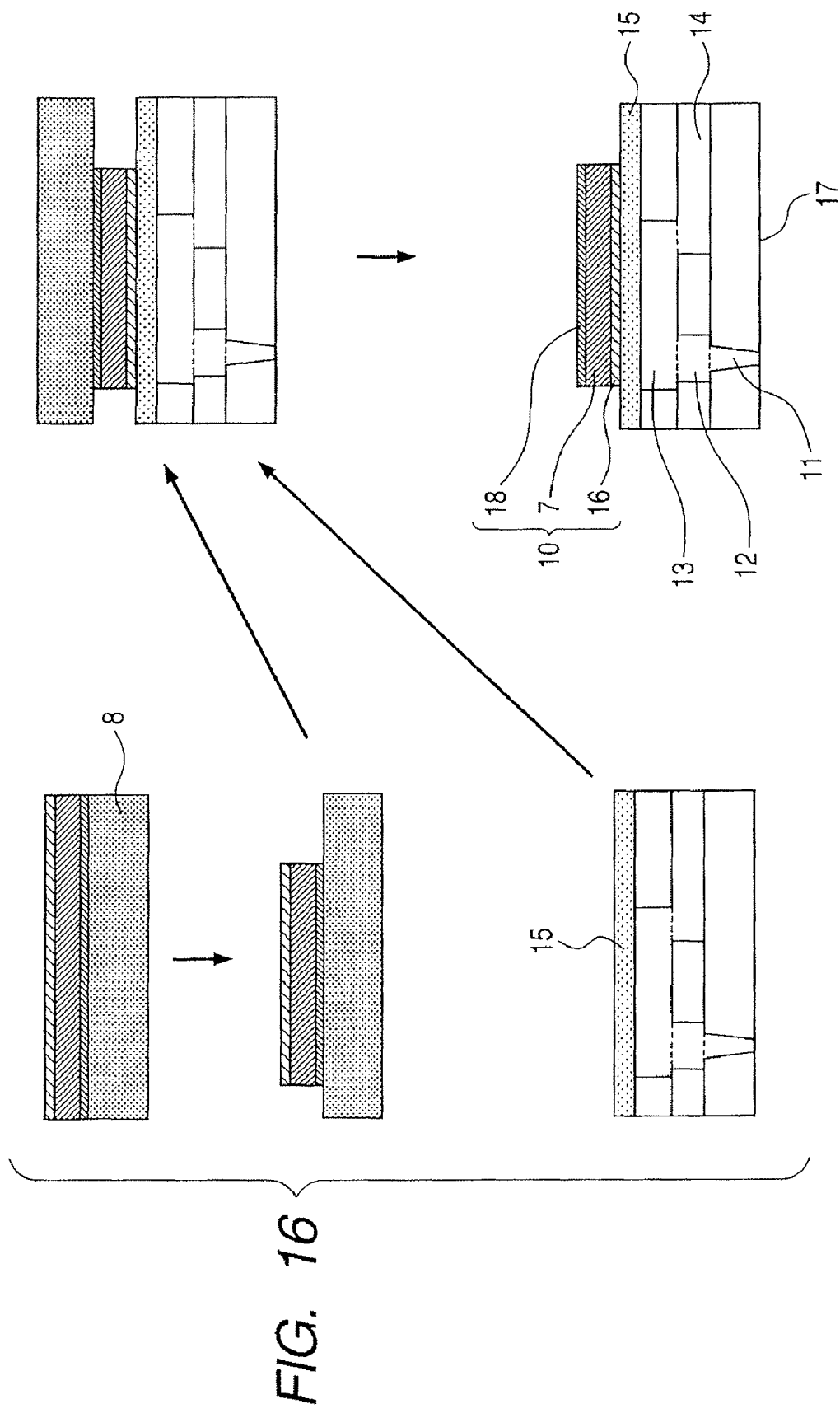
FIG. 16 is a view showing the liquid discharge head manufacturing method.

Moreover, as illustrated in FIG. 16, to begin with, the piezoelectric substance film element 10 is formed on the substrate 8 and is then subjected to the patterning, thus forming the piezoelectric substance film element 10. Separately, the diaphragm 15 is provided on the substrate member, and further there are manufactured the substrate member provided with part of the individual liquid chamber 13, the substrate member provided with the common liquid chamber 14 and the communication hole 12 and the substrate member 17 provided with the discharge port 11. It is possible to exemplify the manufacturing method of forming the liquid discharge head by stacking these substrate members and transferring the piezoelectric substance film element 10 onto the thus stacked substrate members from the substrate.

A joining method at the transferring time may be a method using an inorganic or organic bonding agent; however, metal joining that employs the inorganic material is more preferable. Materials used for the metal joining can be exemplified such as In, Au, Cu, Ni, Pb, Ti, Cr and Pd. When employing these materials, the junction can be attained at a temperature as low as 300° C., the difference in thermal expansion coefficient from the substrate member is decreased, and hence a damage to the piezoelectric substance film element is small as well as avoiding a problem due to a warp, etc., of the piezoelectric substance film element if elongated.

Figure 17A:
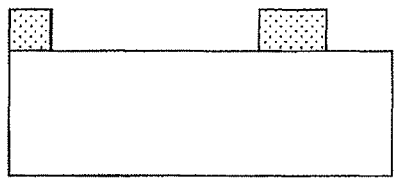
FIGS. 17A, 17B, 17C, 17D, 17E and 17F are views showing a method of forming a communication hole and a common liquid chamber of the liquid discharge head.
Figure 17E:
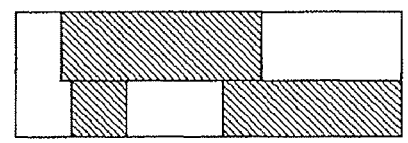
Figure 17B:
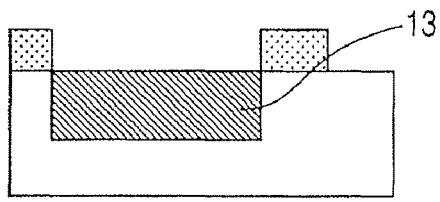
Figure 17F:
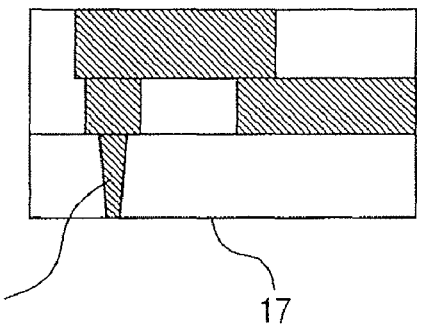
Figure 17C:
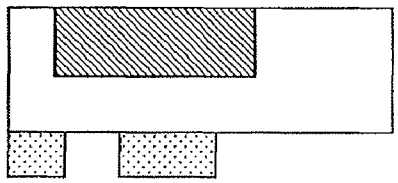
Figure 17D:
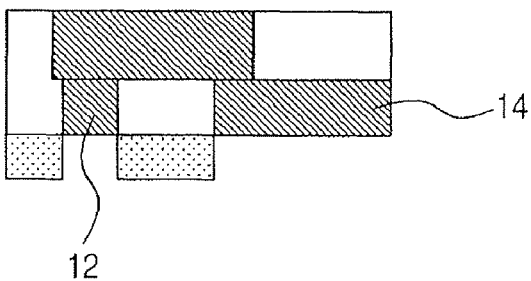

The communication hole 12 and the common liquid chamber 14 according to the first method and the individual liquid chamber 13, the communication hole 12 and the common liquid chamber 14 according to the second method, can be formed by working, for instance, the formation members (substrate members). This working can involve utilizing a method having a step of patterning the formation members (substrate members) by the lithography and a step of removing some of the members. For example, in the case of the second method, the individual liquid chamber 13, the communication hole 12 and the common liquid chamber 14 are formed by steps shown in FIGS. 17A, 17B, 17C, 17D, 17E and 17F. FIG. 17A represents a step of forming a mask for the individual liquid chamber 13, FIG. 17B indicates a step (a hatching portion connotes a worked portion) of having the individual liquid chamber 13 worked by etching, etc., from the upper portion. Further, FIG. 17C represents a step of removing the mask used for forming the individual liquid chamber 13 and forming masks for the communication hole 12 and the common liquid chamber 14, and FIG. 17E indicates a step of working the communication hole 12 and the common liquid chamber 14 by the etching, etc., from the lower portion. Moreover, FIG. 17E schematically illustrates a state of removing the masks employed for the communication hole 12 and the common liquid chamber 14 and forming the individual liquid chamber 13, the communication hole 12 and the common liquid chamber 14. The discharge port 11 is formed by effecting the etching work, machining work and laser work on the substrate member 17. FIG. 17F illustrates a state where the substrate member 17 formed with the discharge port 11 is joined to the substrate member formed with the individual liquid chamber 13, the communication hole 12 and the common liquid chamber 14 after the step in FIG. 17E. It is preferable that the surface of the substrate member provided with the discharge port be subjected to a water-repellent treatment. A method of joining the respective substrate members is the same as the joining method used at the transferring time; however, for others, anodizing junction may also be usable.

In the second method, It is preferable that another substrate member onto which the piezoelectric substance film element 10 is transferred from the substrate 8 involves using a substrate member set in the state of FIG. 17E or 17F. Herein, in the case of forming the diaphragm on the piezoelectric substance film element on the substrate 8, the substrate member is transferred directly onto the individual liquid chamber 13 in the state of FIG. 17E or 17F. Furthermore, in the case of not forming the diaphragm on the piezoelectric substance film element on the substrate 8, the diaphragm is formed by filling the hole of the individual liquid chamber 13 in the state of FIG. 17E or 17F with a resin, thereafter this resin is removed by etching, and the substrate member is transferred after forming the diaphragm. On this occasion, It is preferable that the diaphragm is formed by use of a thin film forming method such as the sputtering method and the CVD (Chemical Vapor Deposition) method. Moreover, the pattern forming step of the piezoelectric substance film element 10 may be done either after or before the transfer.

Figure 18:
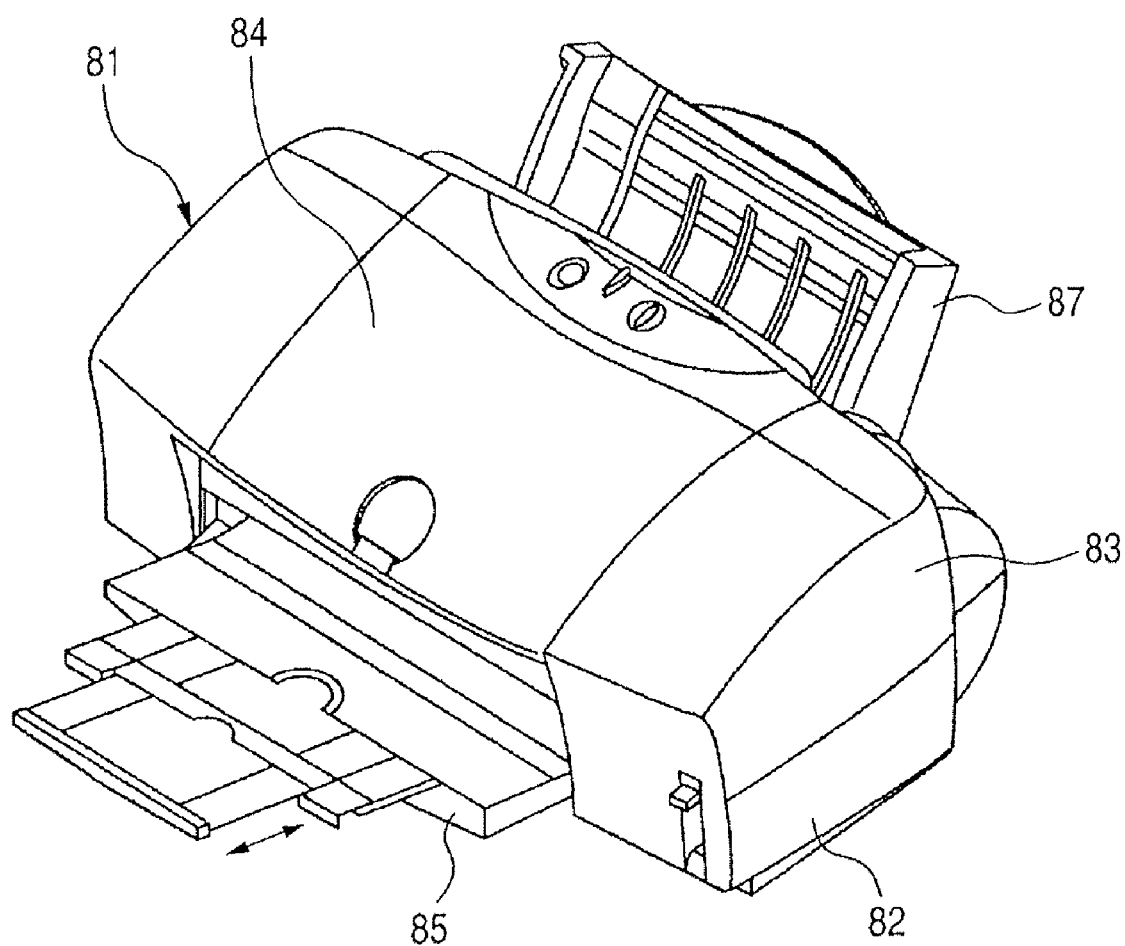
FIG. 18 is a view showing a liquid discharge apparatus.
Figure 19:
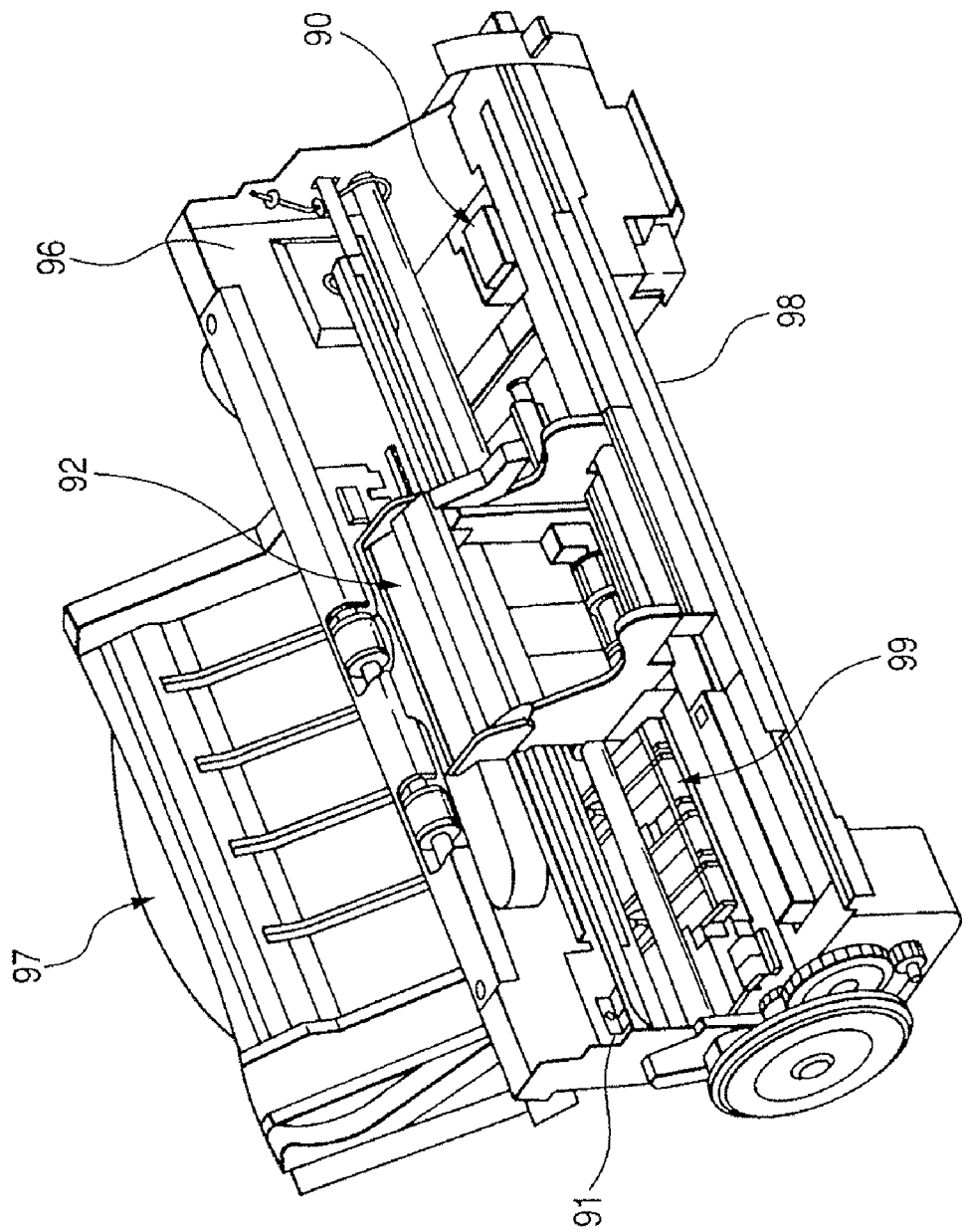
FIG. 19 is a view showing a state where casings of the liquid discharge apparatus are removed.

Next, the liquid discharge apparatus according to the present invention will be described. The liquid discharge apparatus according to the present invention includes the liquid discharge head of the present invention and the means for mounting the liquid discharge head. A liquid discharge apparatus (an inkjet recording apparatus) illustrated in FIGS. 18 and 19 can be given by way of one example of the liquid discharge apparatus according to the present invention. FIG. 19 shows a state where exterior casings 82-85 and 87 of a liquid discharge apparatus 81 are removed. The liquid discharge apparatus 81 has an automatic feeding unit 97 that automatically feeds a record sheet serving as a recording medium into an apparatus body 86. The liquid discharge apparatus 81 further includes a conveying unit 99 for leading the recording sheet fed from the automatic feeing unit 97 to a predetermined recording position and leading the recording sheet to a discharge port 98 from the recording position, a recording unit 91 for recording on the recording sheet conveyed to the recording position, and a recovery unit 90 that executes a recovery process for the recording unit 91. The recording unit 91 is provided with a carriage 92 accommodating the liquid discharge head according to the present invention and carried in reciprocation along on rails.

In this type of liquid discharge apparatus, the carriage 92 is carried along on the rails by electric signals transmitted from a computer, and the piezoelectric substance (piezoelectric member) gets displaced when a drive voltage is applied to the electrodes pinching the piezoelectric member therebetween. Each piezoelectric chamber is pressurized through the diaphragm 15 by dint of the displacement of this piezoelectric member, and the ink is thereby discharged from the discharge port 11, thus performing the printing.

In the liquid discharge apparatus according to the present invention, the liquid can be uniformly discharged at a high speed, and the apparatus can be downsized.

The example given above is exemplified as a printer. However, the liquid discharge apparatus according to the present invention can be utilized as an industrial liquid discharge apparatus in addition to the inkjet recording apparatus, such as a facsimile machine, a multifunction machine and a copying machine.

EXAMPLES

Next, the present invention will be explained by giving examples.

First Example

Pb(thd)(OC$_2$H$_5$)$_2$, Zr(OC$_4$H$_9$-t)$_4$, Ti(OC$_5$H$_{11}$)$_4$ and the oxygen gas are used as the raw materials. By the method of intermittently supplying the raw gas, the film was grown to a thickness of 2.2 μm-2.5 μm on the Si substrate heated at 450° C. in a way that adjusts a supply quantity of the raw gas so that the Zr/(Zr+Ti) ratio becomes 0.50 through 0.53. A diameter of the discharge port of discharging the raw gas was set to 40 Φmm, and there was used a SUS-made nozzle having a wall as thick as 3 mm and exhibiting the high soaking property. The substrate involves employing the Si substrate on which layers of SRO(100)/LaNiO$_3$(100)/CeO$_2$(100)/YSZ(100) are stacked. After the film has been grown, the anneal treatment was conducted for 30 min. at 680° C. in a heating furnace wherein a ceramics PZT powder is disposed in a predetermined position in a heating area, thereby acquiring the piezoelectric substance epitaxial film according to the present invention. It proved from the MRD measurement, etc., that this piezoelectric substance film has the morphotropic phase in which the tetragonal crystal and the rhombohedral crystal exist in mixture, and the domains of the tetragonal crystal are the a-domain and the c-domain. Further, the tilt angles of the c-domain and the a-domain were 0.7° and 0.9°, respectively. Moreover, the volume rate of the c-domain to the total of the a-domain and the c-domain was 43%-45%. Pt/Ti is provided as the upper electrode on this piezoelectric substance film, the constants $d_{31}$, $d_{33}$ were measured by employing the unimorph method and the AFM, with the result that both of these constants could be measured as preferable values. Further, the [001] axial length/[100] axial length ratio of this piezoelectric substance film was 1.020.

This piezoelectric substance element was worked in the shape as shown in FIG. 5, thereby obtaining a structural example of the piezoelectric substance element. It could be SEM-observed that the element configuration has the excellent working accuracy. When evaluating a vibration characteristic by applying an electric field of 20V and 20 KHz, the excellence thereof was confirmed, wherein there is small a displacement amount even by repeating endurances of over $10^8$ times.

First Comparative Example

The film was grown in the same way as the first example except that the substrate temperature was set at 600° C. and that the anneal treatment was omitted, and the piezoelectric substance film was acquired. The film had the volume rate of the c-domain to the total of the a-domain and the c-domain, which exceeds 95%, and the piezoelectric substance element was inferior to that in the first example in terms of the displacement amount and the durability.

Second Example and Second Comparative Example

Figure 6:
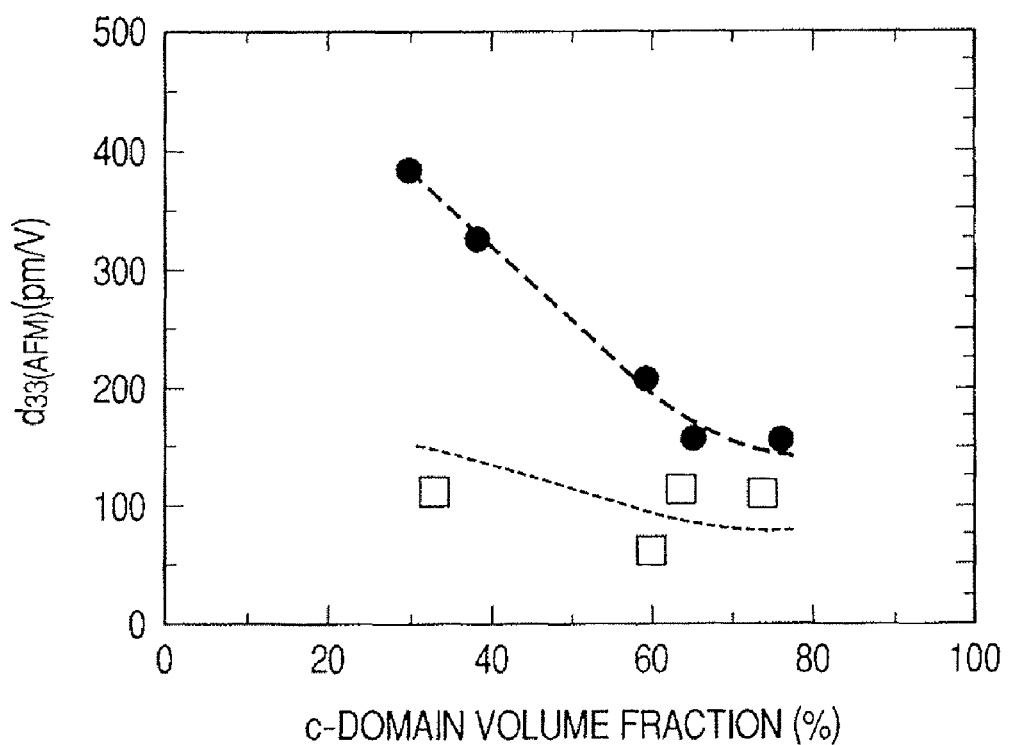
FIG. 6 is a graph showing results of a second example and a second comparative example.

A PZT piezoelectric substance film with only the tetragonal crystals where the composition ratio of Zr/(Zr+Ti) is 0.5 and 0.39, is grown up to a thickness of 2.0 μm on the substrate having a variety of thermal expansion coefficients. SrRuO$_3$ (100) was used as the lower electrode. FIG. 6 shows results of evaluating those with electric field intensity that is on the order of 150 kV/cm. The axis of ordinate in FIG. 6 represents the piezoelectric constant, and the axis of abscissa represents the volume rate of the c-domain to the total of the a-domain and the c-domain. In FIG. 6, the mark ● shows the result of the piezoelectric substance film in which the composition ratio of Zr/(Zr+Ti) is 0.5, and mark □ shows the result of the piezoelectric substance film in which the composition ratio of Zr/(Zr+Ti) is 0.39. Herein, in the piezoelectric substance film of which the volume rate of the c-domain to the total of the a-domain and the c-domain is 25%-60%, the a-domain and the c-domain were in the twinning enantiomorphic relationship wherein the (101) plane is the twinning crystal plane.

It is understood from FIG. 6 that there is a good characteristic of the film with the composition ratio of Zr/(Zr+Ti) that is 0.5. This is considered such that the film having 0.39 as Zr/(Zr+Ti) has a large [001] axial length/[100] axial length ratio and the intra film domain is hard to move. It should be noted that in the results of the constant $d_{33}$ measurements in FIGS. 2 and 6, the absolute value comparison can not be made because of such a measuring method that an area size of the upper electrode is different. The [001] axial length/[100] axial length ratio of the film having the composition indicated by the mark ● according to the present invention was 1.027-1.029, however, the [001] axial length/[100] axial length ratio of the film having the composition indicated by the mark □ was 1.041-1.044.

Third Example

SRO(100)/LNO(100) is grown by sputtering as a buffer layer on a quartz glass substrate, wherein Pt(111)/Ti serves as an electrode layer. Further, a PZT single-axis oriented film showing 0.52 as the composition ratio of Zr/(Zr+Ti) was grown thereon up to a thickness of 2.5 μm. This structure is a PZT/SRO/LNO/Pt/Ti quartz glass substrate. Pt is a natural oriented film, however, LNO and SRO are (100) oriented films. The volume rate of the c-domain to the total of the a-domain and the c-domain was 20%, and the [001] axial length/[100] axial length ratio was 1.019. When evaluating an attaching characteristic of Pt as the upper electrode, there was an excellent residual dielectric polarization value (Pr) that is equal to or larger than 55 μC/cm², and the displacement amount was measured at 0.8% with the electric field intensity of 100 kV/cm. Moreover, though in a state of having a scatter in position, there was a position of exhibiting a large displacement amount exceeding the [001] axial length/[100] axial length ratio.

Fourth Example

The electrode layer and the buffer layer were grown with a structure of LSCO(100)/LNO(100)/Ir(111)/Ta on the Si(100) substrate. An oxide film having a thickness of 350 nm was interposed between the Ta/Si substrates so that contraction is restrained till the Si substrate is cooled down to a room temperature from a temperature 490° C. when the film was grown. The PZT single-axis oriented film showing 0.52 as the composition ratio of Zr/(Zr+Ti) was grown thereon up to a thickness of 2.0 μm. The volume rate of the c-domain to the total of the a-domain and the c-domain was 25%, the [001] axial length/[100] axial length ratio was 1.028, and the tilt angle of the a-domain was 1.0°-1.2°. The crystal structure is mainly the tetragonal crystal, however, the film contained the rhombohedral crystal other than the tetragonal crystal. When evaluating the attaching characteristic of Pt as the upper electrode, there was an excellent residual dielectric polarization value (Pr) that is equal to or larger than 60 μC/cm², and the displacement amount was measured at 1.0% or larger with the electric field intensity of 100 kV/cm.

Fifth Example

The PZT film was grown up to the thickness of 2.0 μm in the same way as in the first example so that the composition ratio of Zr/(Zr+Ti) becomes 0.45. It proved from the MRD measurement that this film is the tetragonal crystal, wherein the a-domain and the c-domain exist in mixture. Further, the volume rate of the c-domain to the total of the a-domain and the c-domain was 30%. The tilt angle of the c-domain was 0.2°. A Pt/Ti upper electrode having 100 μmΦ is provided on this film, and, when evaluating the characteristic thereof, there was confirmed a value as large as 280 in the constant $d_{33}$ characteristic with the electric field intensity of 150 kV/cm.

Sixth Example

The PZT film was grown up to the thickness of 2.0 μm in the same way as in the first example so that the composition ratio of Zr/(Zr+Ti) becomes 0.64. It proved from the MRD measurement that this film is a film where the tetragonal crystal and the rhombohedral crystal exist in mixture, and the tetragonal crystal is a film where a-domain and the c-domain exist in mixture. Further, the rhombohedral crystal was (100)-oriented, and the volume rate of the c-domain to the total of the a-domain and the c-domain was 26% through 28%. The [001] axial length/[100] axial length ratio was 1.015. When evaluating the characteristic of this film, there was a value as large as 300 in the constant $d_{33}$ characteristic with the electric field intensity of 150 kV/cm.

Third Comparative Example

When the PZT film with the composition ratio of Zr/(Zr+Ti) that is 0.75 was grown, it proved from the MRD measurement that the film has only the rhombohedral crystal, and hence none of the existent of the c-domain was observed. The constant $d_{33}$ characteristic was less than 80 with the electric field intensity of 150 kV/cm.

This application claims priority from Japanese Patent Application Nos. 2005-012131 filed on Jan. 19, 2005, 2005-034956 filed on Feb. 10, 2005, and 2005-257132 filed on Sep. 5, 2005, which are hereby incorporated by reference herein.

The invention claimed is:

1. A piezoelectric substance element having a piezoelectric substance film and a pair of electrodes connected to said piezoelectric substance film on a substrate,
wherein a main component of said piezoelectric substance film is Pb(Zr, Ti)O₃, a composition ratio of Zr/(Zr+Ti) is over 0.4 but less than 0.7, said piezoelectric substance film is a film having at least a tetragonal crystal a-domain and a c-domain within a range of ±10° with respect to the surface of said substrate, and a volume rate of the c-domain to the total of the a-domain and the c-domain is equal to or larger than 20% and equal to or smaller than 60%.

2. A piezoelectric substance element according to claim 1, wherein the composition ratio of Zr/(Zr+Ti) is equal to or larger than 0.45 but less than 0.65.

3. A piezoelectric substance element according to claim 1, wherein said piezoelectric substance film has any one of a tetragonal crystal, a pseudo cubic crystal and a rhombohedral crystal.

4. A piezoelectric substance element according to claim 1, wherein said piezoelectric substance film is an epitaxial mono-crystal film or a single-axis oriented film.

5. A piezoelectric substance element according to claim 1, wherein the a-domain and the c-domain change when applying an electric field.

6. A piezoelectric substance element according to claim 5, wherein at least some of the a-domain and the c-domain are in a twinning enantiomorphic relationship where a (N0N) (N is an integer) plane is a twinning crystal plane.

7. A piezoelectric substance element according to claim 1, wherein said substrate has a Si(100) plane on its surface and a buffer layer on the Si(100) plane.

8. A piezoelectric substance element having a piezoelectric substance film and a pair of electrodes connected to said piezoelectric substance film on a substrate,
wherein a main component of said piezoelectric substance film is Pb(Zr, Ti)O₃, a composition ratio of Zr/(Zr+Ti) is over 0.4 but less than 0.7, said piezoelectric substance film is a film having at least a tetragonal crystal a-domain and a c-domain within a range of ±10° with respect to the surface of said substrate, and at least some of the a-domain and the c-domain are in a twinning enantiomorphic relationship where a (N0N) (N is an integer) plane is a twinning crystal plane.

9. A piezoelectric substance element according to claim 8, wherein the volume rate of the c-domain to the total of the a-domain and the c-domain is equal to or larger than 20% and equal to or smaller than 60%.

10. A piezoelectric substance element according to claim 9, wherein the volume rate is equal to or larger than 25% and equal to or smaller than 60%.

11. A piezoelectric substance element having a piezoelectric substance film and a pair of electrodes connected to said piezoelectric substance film, wherein a main component of said piezoelectric substance film is Pb(Zr, Ti)O$_3$, said piezoelectric substance film is a film having a tetragonal crystal a-domain and a c-domain, and, in a [001] axial length and a [100] axial length that configure the domains, a [001] axial length/[100] axial length ratio is equal to or larger than 1.004 and equal to or smaller than 1.040.

12. A piezoelectric substance element according to claim 11, wherein the [001] axial length/[100] axial length ratio is equal to or larger than 1.005 and equal to or smaller than 1.036.

13. A piezoelectric substance element according to claim 12, wherein the [001] axial length/[100] axial length ratio is equal to or larger than 1.015 and equal to or smaller than 1.029.

14. A piezoelectric substance element according to claim 11, wherein the composition ratio of Zr/(Zr+Ti) is over 0.4 but less than 0.7.

15. A piezoelectric substance element according to claim 11, wherein the volume rate of the c-domain to the total of the a-domain and the c-domain is equal to or larger than 20% and equal to or smaller than 60%.

16. A piezoelectric substance element according to claim 11, wherein at least some of the a-domain and the c-domain are in a twinning enantiomorphic relationship where a (N0N) (N is an integer) plane is a twinning crystal plane.

17. A liquid discharge head comprising a piezoelectric substance element according to claim 1, 8 or 11, wherein a liquid is discharged by employing said piezoelectric substance element.

18. A liquid discharge apparatus comprising:
a liquid discharge head according to claim 17; and
means for mounting said liquid discharge head.

* * * * *